(12) United States Patent
Chen et al.

(10) Patent No.: US 11,848,246 B2
(45) Date of Patent: Dec. 19, 2023

(54) INTEGRATED CIRCUIT PACKAGE AND METHOD

(71) Applicant: Taiwan Semiconductor Manufacturing Co., Ltd., Hsinchu (TW)

(72) Inventors: Hsien-Wei Chen, Hsinchu (TW); Ming-Fa Chen, Taichung (TW); Sung-Feng Yeh, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 208 days.

(21) Appl. No.: 17/314,618

(22) Filed: May 7, 2021

(65) Prior Publication Data

US 2022/0310470 A1    Sep. 29, 2022

Related U.S. Application Data

(60) Provisional application No. 63/165,280, filed on Mar. 24, 2021.

(51) Int. Cl.
| | |
|---|---|
| *H01L 23/36* | (2006.01) |
| *H01L 27/06* | (2006.01) |
| *H01L 21/56* | (2006.01) |
| *H01L 25/065* | (2023.01) |
| *H01L 23/31* | (2006.01) |

(52) U.S. Cl.
CPC .............. *H01L 23/36* (2013.01); *H01L 21/56* (2013.01); *H01L 23/31* (2013.01); *H01L 25/0652* (2013.01); *H01L 27/0688* (2013.01)

(58) Field of Classification Search
CPC ......... H01L 23/36; H01L 21/56; H01L 23/31; H01L 25/0652; H01L 27/0688; H01L 23/16; H01L 23/3107; H01L 23/3121; H01L 23/367; H01L 23/3672; H01L 23/3675; H01L 23/42; H01L 21/302; H01L 21/304; H01L 21/30625
See application file for complete search history.

(56) References Cited

U.S. PATENT DOCUMENTS

| | | | |
|---|---|---|---|
| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |

(Continued)

FOREIGN PATENT DOCUMENTS

| | | |
|---|---|---|
| CN | 112530913 A | 3/2021 |
| KR | 20170020663 A | 2/2017 |

(Continued)

*Primary Examiner* — Eduardo A Rodela
(74) *Attorney, Agent, or Firm* — Slater Matsil, LLP

(57) ABSTRACT

In an embodiment, a device includes: an interposer; a first integrated circuit device attached to the interposer; a second integrated circuit device attached to the interposer adjacent the first integrated circuit device; a heat dissipation die on the second integrated circuit device; and an encapsulant around the heat dissipation die, the second integrated circuit device, and the first integrated circuit device, a top surface of the encapsulant being coplanar with a top surface of the heat dissipation die and a top surface of the first integrated circuit device.

20 Claims, 34 Drawing Sheets

(56) References Cited

U.S. PATENT DOCUMENTS

| | | | |
|---|---|---|---|
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 9,978,661 B2 | 5/2018 | Im et al. | |
| 10,163,750 B2* | 12/2018 | Yu | H01L 25/0652 |
| 10,170,457 B2* | 1/2019 | Chen | H01L 24/97 |
| 10,510,650 B2 | 12/2019 | Yu et al. | |
| 10,714,378 B2* | 7/2020 | Kelly | H01L 23/3142 |
| 10,964,618 B2 | 3/2021 | Lee et al. | |
| 10,978,409 B2* | 4/2021 | Cho | H01L 23/3675 |
| 11,056,414 B2 | 7/2021 | Jang et al. | |
| 11,164,855 B2* | 11/2021 | Chen | H01L 24/13 |
| 11,217,535 B2* | 1/2022 | Elsherbini | H01L 23/3675 |
| 11,282,759 B2* | 3/2022 | Hsu | H01L 25/0655 |
| 11,450,581 B2* | 9/2022 | Lo | H01L 23/49827 |
| 2007/0210438 A1* | 9/2007 | Briere | H01L 23/367 257/E23.092 |
| 2012/0049339 A1* | 3/2012 | Wang | H01L 23/49827 257/E23.101 |
| 2013/0217188 A1* | 8/2013 | Wang | H01L 23/433 438/118 |
| 2014/0239484 A1* | 8/2014 | Matsuda | H01L 21/4871 219/400 |
| 2018/0226366 A1 | 8/2018 | Kim et al. | |

FOREIGN PATENT DOCUMENTS

| | | |
|---|---|---|
| KR | 20180090527 A | 8/2018 |
| KR | 20200045098 A | 5/2020 |
| KR | 20200061165 A | 6/2020 |
| TW | 201822311 A | 6/2018 |
| TW | 201935630 A | 9/2019 |

* cited by examiner

INTEGRATED CIRCUIT PACKAGE AND METHOD

PRIORITY CLAIM AND CROSS-REFERENCE

This application claims the benefit of U.S. Provisional Application No. 63/165,280, filed on Mar. 24, 2021, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
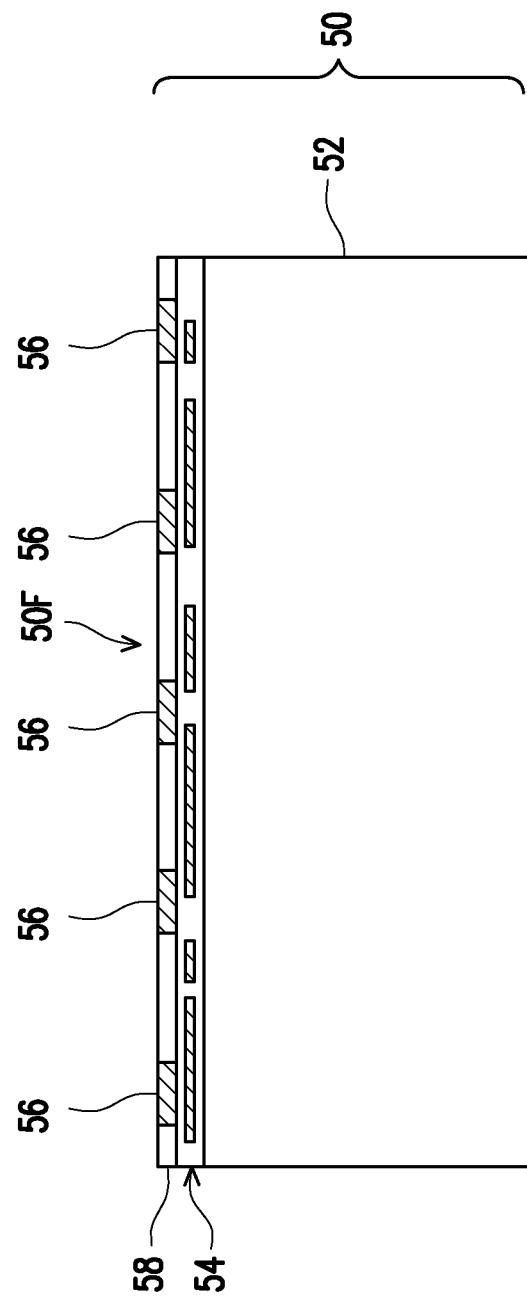
FIG. 1 is a cross-sectional view of an integrated circuit die.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, an integrated circuit package is formed that includes integrated circuit devices of various thicknesses, and a heat dissipation die over the integrated circuit device(s) with lesser thicknesses. The heat dissipation die is exposed through an encapsulant that is formed around the integrated circuit devices. Inclusion of the heat dissipation die reduces the amount of encapsulant over the integrated circuit device(s) with lesser thicknesses, which can help avoid stress concentration and die cracking in the integrated circuit package. Further, a heat spreader may be attached to the top surface of the heat dissipation die, which can help improve heat dissipation efficiency in the integrated circuit package.

FIG. 1 is a cross-sectional view of an integrated circuit die 50. Multiple integrated circuit dies 50 will be packaged in subsequent processing to form integrated circuit packages. Each integrated circuit die 50 may be a logic die (e.g., central processing unit (CPU), graphics processing unit (GPU), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, an interface die, a sensor die, a micro-electro-mechanical-system (MEMS) die, a signal processing die (e.g., digital signal processing (DSP) die), a front-end die (e.g., analog front-end (AFE) dies), the like, or combinations thereof (e.g., a system-on-a-chip (SoC) die). The integrated circuit die 50 may be formed in a wafer, which may include different die regions that are singulated in subsequent steps to form a plurality of integrated circuit dies 50. The integrated circuit die 50 includes a semiconductor substrate 52, an interconnect structure 54, die connectors 56, and a dielectric layer 58.

The semiconductor substrate 52 may be a substrate of silicon, doped or undoped, or an active layer of a semiconductor-on-insulator (SOI) substrate. The semiconductor substrate 52 may include other semiconductor materials, such as germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 52 has an active surface (e.g., the surface facing upward in FIG. 1) and an inactive surface (e.g., the surface facing downward in FIG. 1). Devices are at the active surface of the semiconductor substrate 52. The devices may be active devices (e.g., transistors, diodes, etc.), capacitors, resistors, etc. The inactive surface may be free from devices.

The interconnect structure 54 is over the active surface of the semiconductor substrate 52, and is used to electrically connect the devices of the semiconductor substrate 52 to form an integrated circuit. The interconnect structure 54 may include one or more dielectric layer(s) and respective metallization layer(s) in the dielectric layer(s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The metallization layer(s) may include conductive vias and/or conductive lines to interconnect the devices of the semiconductor substrate 52. The metallization layer(s) may be formed of a conductive material, such as a metal, such as copper, cobalt, aluminum, gold, combinations thereof, or the like. The interconnect structure 54 may be formed by a damascene process, such as a single damascene process, a dual damascene process, or the like.

Die connectors 56 are at the front side 50F of the integrated circuit die 50. The die connectors 56 may be conductive pillars, pads, or the like, to which external connections are made. The die connectors 56 are in and/or on the interconnect structure 54. For example, the die connectors 56 may be part of an upper metallization layer of the interconnect structure 54. The die connectors 56 can be formed of a metal, such as copper, aluminum, or the like, and can be formed by, for example, plating, or the like.

Optionally, solder regions (not separately illustrated) may be disposed on the die connectors 56 during formation of the integrated circuit die 50. The solder regions may be used to perform chip probe (CP) testing on the integrated circuit die 50. For example, the solder regions may be solder balls, solder bumps, or the like, which are used to attach a chip probe to the die connectors 56. Chip probe testing may be performed on the integrated circuit die 50 to ascertain whether the integrated circuit die 50 is a known good die (KGD). Thus, only integrated circuit dies 50, which are KGDs, undergo subsequent processing are packaged, and dies which fail the chip probe testing are not packaged. After testing, the solder regions may be removed in subsequent processing steps.

A dielectric layer 58 is at the front side 50F of the integrated circuit die 50. The dielectric layer 58 is in and/or on the interconnect structure 54. For example, the dielectric layer 58 may be an upper dielectric layer of the interconnect structure 54. The dielectric layer 58 laterally encapsulates the die connectors 56. The dielectric layer 58 may be an oxide, a nitride, a carbide, a polymer, the like, or a combination thereof. The dielectric layer 58 may be formed, for example, by spin coating, lamination, chemical vapor deposition (CVD), or the like. Initially, the dielectric layer 58 may bury the die connectors 56, such that the top surface of the dielectric layer 58 is above the top surfaces of the die connectors 56. The die connectors 56 are exposed through the dielectric layer 58 during formation of the integrated circuit die 50. Exposing the die connectors 56 may remove any solder regions that may be present on the die connectors 56. A removal process can be applied to the various layers to remove excess materials over the die connectors 56. The removal process may be a planarization process such as a chemical mechanical polish (CMP), an etch-back, combinations thereof, or the like. After the planarization process, top surfaces of the die connectors 56 and the dielectric layer 58 are coplanar (within process variations) and are exposed at the front side 50F of the integrated circuit die 50.

Figure 2A:
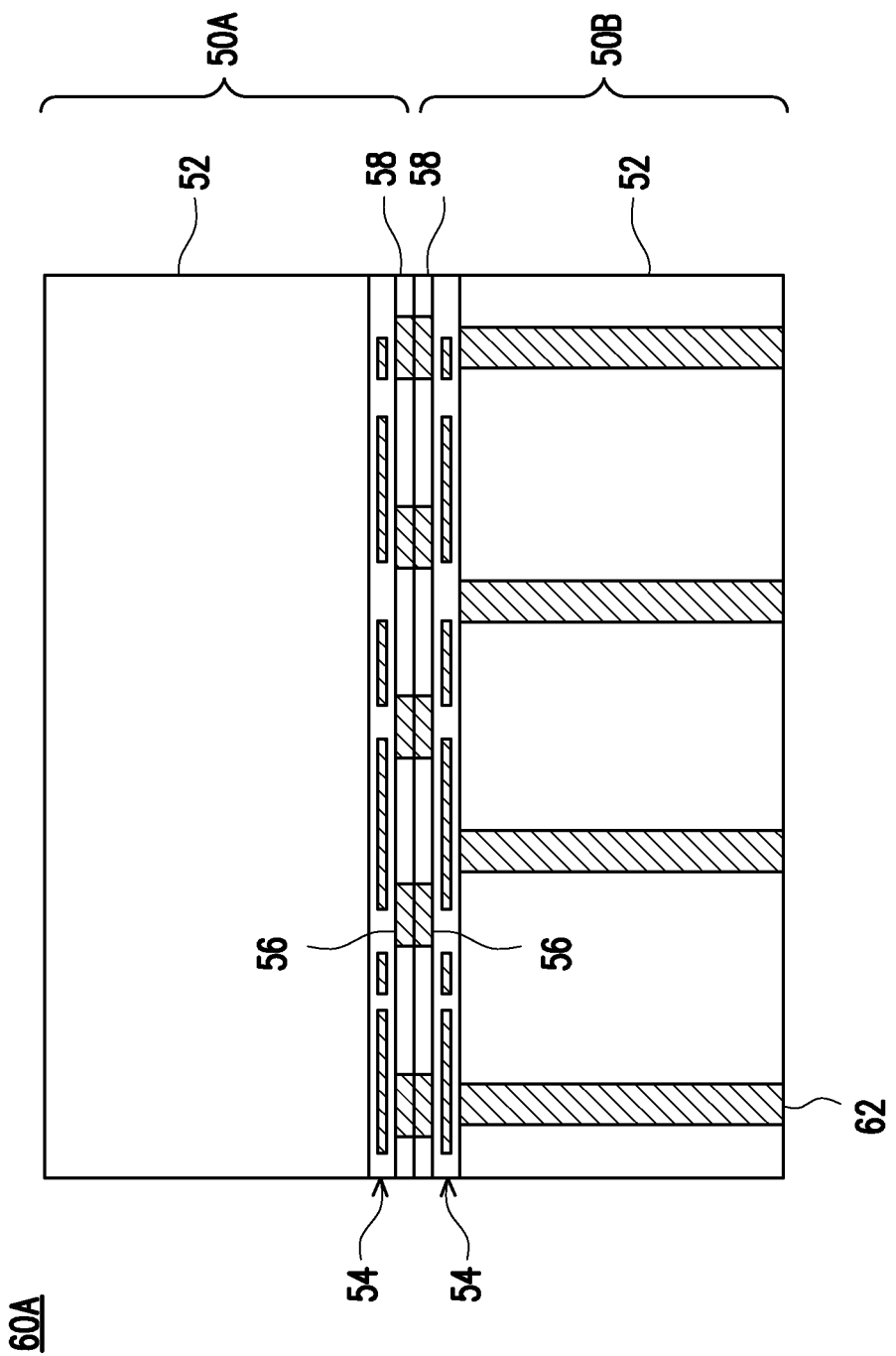
FIGS. 2A-2B are cross-sectional views of die stacks, in accordance with some embodiments.
Figure 2B:
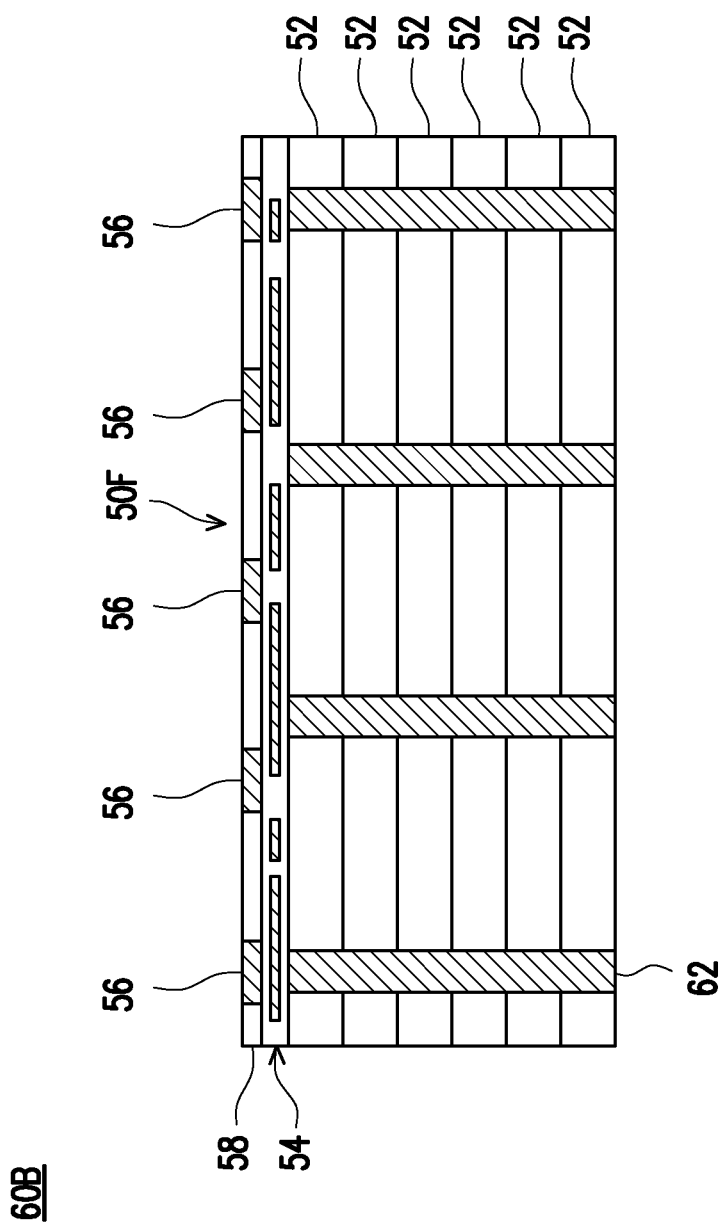

FIGS. 2A-2B are cross-sectional views of die stacks 60A, 60B, in accordance with some embodiments. The die stack 60A, 60B may each have a single function (e.g., a logic device, memory die, etc.), or may have multiple functions. In some embodiments, the die stack 60A is a logic device such as a system-on-integrated-chip (SoIC) device and the die stack 60B is a memory device such as high bandwidth memory (HBM) device.

As shown in FIG. 2A, the die stack 60A includes two bonded integrated circuit dies 50 (e.g., a first integrated circuit die 50A and a second integrated circuit die 50B). In some embodiments, the first integrated circuit die 50A is a logic die, and the second integrated circuit die 50B is an interface die. The interface die bridges the logic die to memory dies, and translates commands between the logic die and the memory dies. In some embodiments, the first integrated circuit die 50A and the second integrated circuit die 50B are bonded such that the active surfaces are facing each other (e.g., are "face-to-face" bonded). Conductive vias 62 may be formed through one of the integrated circuit dies 50 so that external connections may be made to the die stack 60A. The conductive vias 62 may be through-substrate vias (TSVs), such as through-silicon vias or the like. In the embodiment shown, the conductive vias 62 are formed in the second integrated circuit die 50B (e.g., the interface die). The conductive vias 62 extend through the semiconductor substrate 52 of the respective integrated circuit die 50, to be physically and electrically connected to the metallization layer(s) of the interconnect structure 54. Methods of forming the die stack 60A will be subsequently described.

As shown in FIG. 2B, the die stack 60B is a stacked device that includes multiple semiconductor substrates 52. For example, the die stack 60B may be a memory device that includes multiple memory dies such as a hybrid memory cube (HMC) device, a high bandwidth memory (HBM) device, or the like. Each of the semiconductor substrates 52 may (or may not) have a separate interconnect structure 54. The semiconductor substrates 52 are connected by conductive vias 62.

FIGS. 3-11 are cross-sectional views of intermediate stages in the manufacturing of an integrated circuit package, in accordance with some embodiments. Specifically, an integrated circuit package 150 is formed by bonding integrated circuit devices 80 to a wafer 70. In an embodiment, the integrated circuit package 150 is a chip-on-wafer (CoW) package, although it should be appreciated that embodiments may be applied to other three-dimensional integrated circuit (3DIC) packages. The wafer 70 has a package region 70A, which include a device formed therein, such as an interposer 110. The package region 70A will be singulated in subsequent processing to form the integrated circuit package 150, which includes a singulated portion of the wafer 70 (e.g., an interposer 110) and the integrated circuit devices 80 which are bonded to that singulated portion of the wafer 70. The integrated circuit package 150 is then mounted to a package substrate 200. In an embodiment, the resulting package is a chip-on-wafer-on-substrate (CoWoS) package, although it should be appreciated that embodiments may be applied to other 3DIC packages.

Processing of one package region 70A of the wafer 70 is illustrated. It should be appreciated that any number of package regions 70A of a wafer 70 can be simultaneously processed and singulated to form multiple integrated circuit packages 150 from the singulated portions of the wafer 70.

Figure 3:
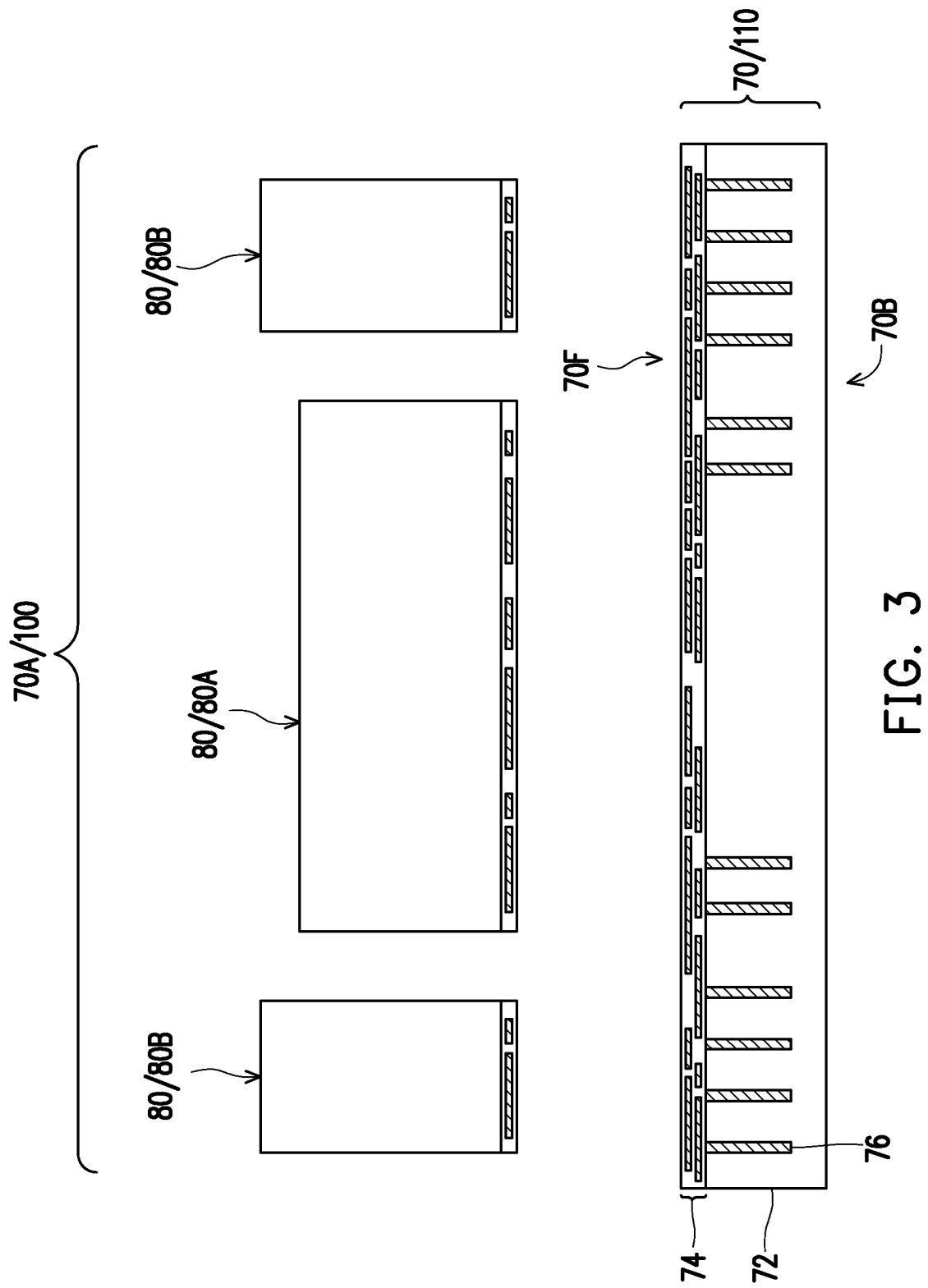
FIGS. 3-11 are cross-sectional views of intermediate stages in the manufacturing of an integrated circuit package, in accordance with some embodiments.

In FIG. 3, a wafer 70 is obtained or formed. The wafer 70 comprises devices in the package region 70A, which will be singulated in subsequent processing to be included in the integrated circuit package 150. The devices in the wafer 70 may be interposers, integrated circuits dies, or the like. In some embodiments, interposers 110 are formed in the wafer 70, which include a substrate 72, an interconnect structure 74, and conductive vias 76.

The substrate 72 may be a bulk semiconductor substrate, a semiconductor-on-insulator (SOI) substrate, a multi-layered semiconductor substrate, or the like. The substrate 72 may include a semiconductor material, such as silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The substrate 72 may be doped or undoped. In embodiments where interposers are formed in the wafer 70, the substrate 72 generally does not include active devices therein, although the interposers may include passive devices formed in and/or on a front surface (e.g., the surface facing upward in FIG. 3) of the substrate 72. In embodiments where integrated circuits devices are formed in the wafer 70, active devices such as transistors, capacitors, resistors, diodes, and the like, may be formed in and/or on the front surface of the substrate 72.

The interconnect structure 74 is over the front surface of the substrate 72, and is used to electrically connect the devices (if any) of the substrate 72. The interconnect structure 74 may include one or more dielectric layer(s) and respective metallization layer(s) in the dielectric layer(s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The metallization layer(s) may include conductive vias and/or conductive lines to interconnect any devices together and/or to an external device. The metallization layer(s) may be formed of a conductive material, such as a metal, such as copper, cobalt, aluminum, gold, combinations thereof, or the like. The interconnect structure 74 may be formed by a damascene process, such as a single damascene process, a dual damascene process, or the like.

In some embodiments, die connectors and a dielectric layer (not separately illustrated) are at the front side 70F of the wafer 70. Specifically, the wafer 70 may include die connectors and a dielectric layer that are similar to those of the integrated circuit die 50 described for FIG. 1. For example, the die connectors and the dielectric layer may be part of an upper metallization layer of the interconnect structure 74.

The conductive vias 76 extend into the interconnect structure 74 and/or the substrate 72. The conductive vias 76 are electrically connected to metallization layer(s) of the interconnect structure 74. The conductive vias 76 are also sometimes referred to as TSVs. As an example to form the conductive vias 76, recesses can be formed in the interconnect structure 74 and/or the substrate 72 by, for example, etching, milling, laser techniques, a combination thereof, and/or the like. A thin dielectric material may be formed in the recesses, such as by using an oxidation technique. A thin barrier layer may be conformally deposited in the openings, such as by CVD, atomic layer deposition (ALD), physical vapor deposition (PVD), thermal oxidation, a combination thereof, and/or the like. The barrier layer may be formed of an oxide, a nitride, a carbide, combinations thereof, or the like. A conductive material may be deposited over the barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from a surface of the interconnect structure 74 or the substrate 72 by, for example, a CMP. Remaining portions of the barrier layer and conductive material form the conductive vias 76.

Figure 4:
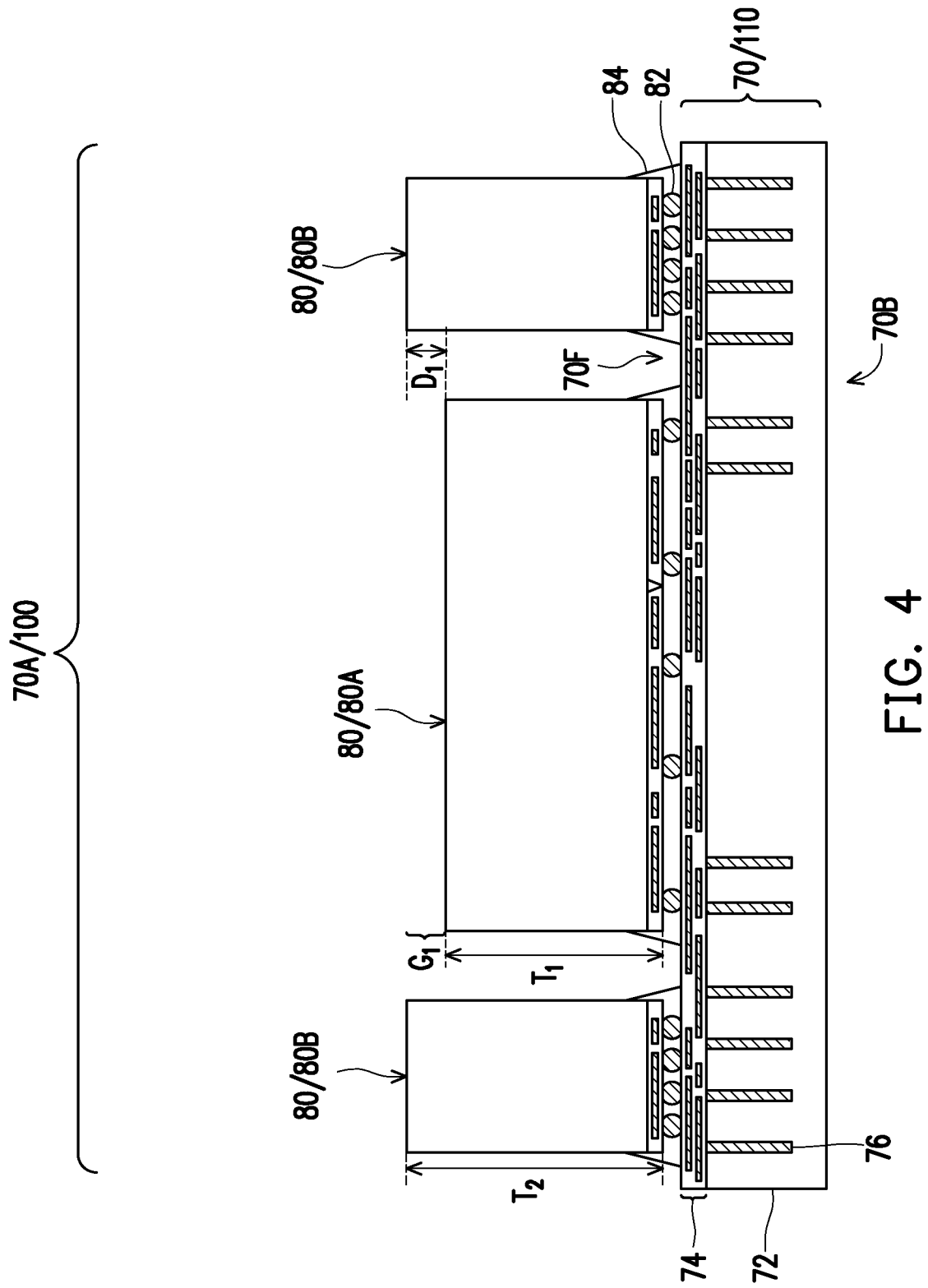

In FIG. 4, integrated circuit devices 80 (e.g., a first integrated circuit device 80A and a plurality of second integrated circuit devices 80B) are attached to the wafer 70. A desired type and quantity of integrated circuit devices 80 are attached in the package region 70A. In the embodiment shown, multiple integrated circuit devices 80 are placed adjacent one another, including the first integrated circuit device 80A and the second integrated circuit devices 80B, where the first integrated circuit device 80A is between the second integrated circuit devices 80B. The first integrated circuit device 80A may have a different function from the second integrated circuit devices 80B. The first integrated circuit device 80A may be a logic device, such as a central processing unit (CPU), graphics processing unit (GPU), system-on-a-chip (SoC), microcontroller, or the like. The second integrated circuit device 80B may be a memory device, such as a dynamic random access memory (DRAM) die, static random access memory (SRAM) die, hybrid memory cube (HMC) module, a high bandwidth memory (HBM) module, or the like. The first integrated circuit device 80A and the second integrated circuit device 80B may be formed in processes of a same technology node, or may be formed in processes of different technology nodes. For example, the first integrated circuit device 80A may be of a more advanced process node than the second integrated circuit device 80B.

In the illustrated embodiment, the integrated circuit devices 80 are attached to the wafer 70 with solder bonds, such as with conductive connectors 82. The integrated circuit devices 80 may be placed on the interconnect structure 74 using, e.g., a pick-and-place tool. The conductive connectors 82 may be formed of a conductive material that is reflowable, such as solder, copper, aluminum, gold, nickel, silver, palladium, tin, the like, or a combination thereof. In some embodiments, the conductive connectors 82 are formed by initially forming a layer of solder through methods such as evaporation, electroplating, printing, solder transfer, ball placement, or the like. Once a layer of solder has been formed on the structure, a reflow may be performed in order to shape the conductive connectors 82 into desired bump shapes. Attaching the integrated circuit devices 80 to the wafer 70 may include placing the integrated circuit devices 80 on the wafer 70 and reflowing the conductive connectors 82. The conductive connectors 82 form joints between corresponding die connectors of the wafer 70 and the integrated circuit devices 80, electrically connecting the interposer 110 to the integrated circuit devices 80.

An underfill 84 may be formed around the conductive connectors 82, and between the wafer 70 and the integrated circuit devices 80. The underfill 84 may reduce stress and protect the joints resulting from the reflowing of the conductive connectors 82. The underfill 84 may be formed of an underfill material such as a molding compound, epoxy, or the like. The underfill 84 may be formed by a capillary flow process after the integrated circuit devices 80 are attached to the wafer 70, or may be formed by a suitable deposition method before the integrated circuit devices 80 are attached to the wafer 70. The underfill 84 may be applied in liquid or semi-liquid form and then subsequently cured.

In other embodiments (described for FIG. 15), the integrated circuit devices 80 are attached to the wafer 70 with direct bonds. For example, hybrid bonding, fusion bonding, dielectric bonding, metal bonding, or the like may be used to directly bond corresponding dielectric layers and/or die connectors of the wafer 70 and the integrated circuit devices 80 without the use of adhesive or solder. The underfill 84 may be omitted when direct bonding is used. Further, a mix of bonding techniques could be used, e.g., some integrated circuit devices 80 could be attached to the wafer 70 by solder bonds, and other integrated circuit devices 80 could be attached to the wafer 70 by direct bonds.

The integrated circuit device 80A may be an integrated circuit die (similar to the integrated circuit die 50 described for FIG. 1), or may be a die stack (similar to the die stack 60A described for FIG. 2A). In this embodiment, the first integrated circuit device 80A is an integrated circuit die. In other embodiments (subsequently described in greater detail), the first integrated circuit device 80A is a die stack.

The integrated circuit device 80B may be an integrated circuit die (similar to the integrated circuit die 50 described for FIG. 1), or may be a die stack (similar to the die stack 60B described for FIG. 2B). In this embodiment, the first integrated circuit device 80B is a die stack. Die stacks, and particularly memory die stacks such as high bandwidth memory (HBM) devices, have a large thickness as a result of having multiple semiconductor substrates. For example, high capacity HBM devices can have twelve or more semiconductor substrates. When the second integrated circuit devices 80B are memory die stacks, they can have a greater thickness than the first integrated circuit device 80A. For example, the first integrated circuit device 80A can have a thickness $T_1$ in the range of 200 μm to 775 μm, and the second integrated circuit devices 80B can each have a thickness $T_2$ in the range of 300 μm to 1000 μm, with a difference $D_1$ between the thickness $T_1$ and the thickness $T_2$ being in the range of 50 μm to 800 μm. Accordingly, the top surfaces of the second integrated circuit devices 80B are disposed further from the wafer 70 than the top surface of the first integrated circuit device 80A. Thus, a gap $G_1$ exists over the first integrated circuit device 80A, with the gap $G_1$ being defined by the area between the top surface of the first integrated circuit device 80A and the top surfaces of the second integrated circuit devices 80B.

Figure 5:
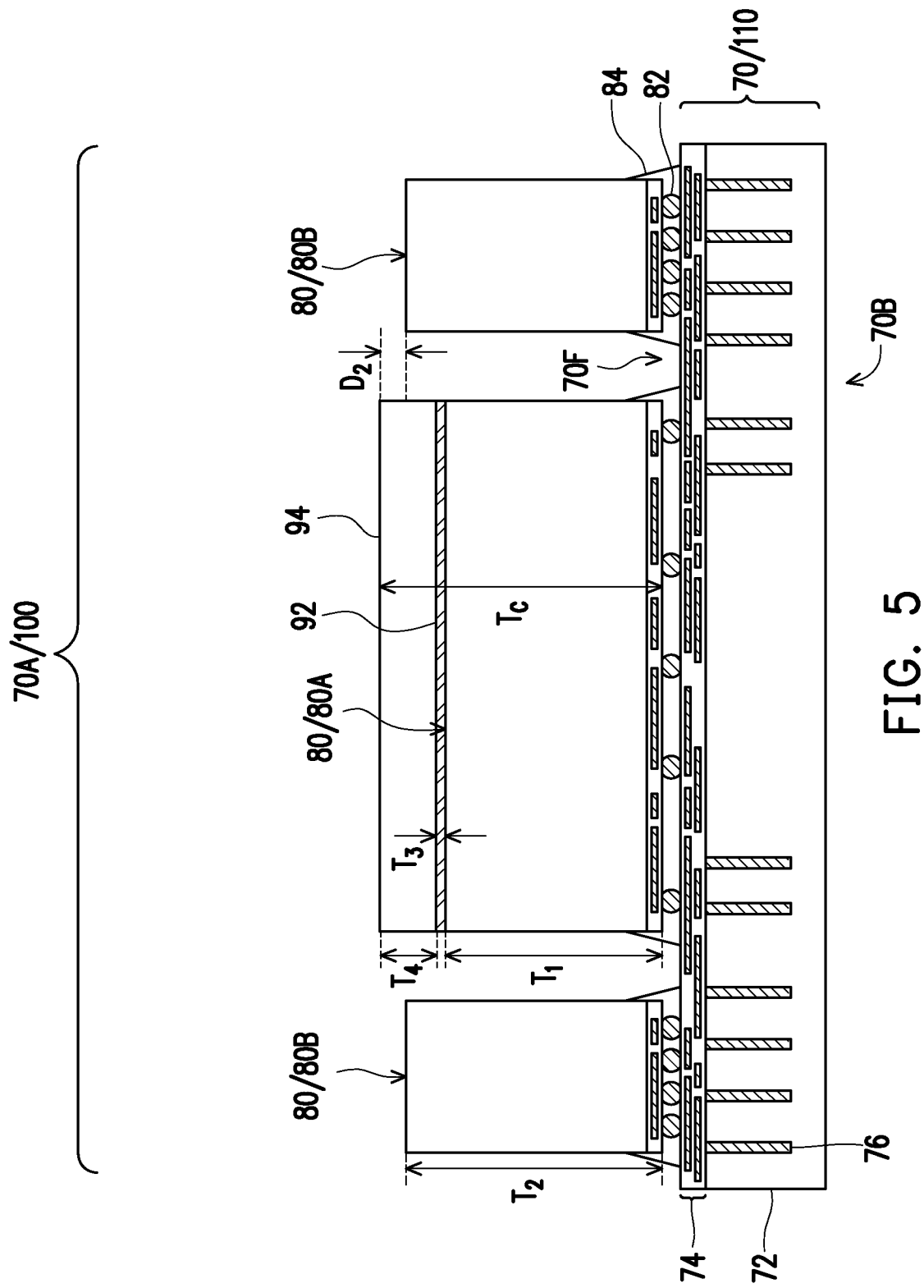

In FIG. 5, a heat dissipation die 94 is attached to the first integrated circuit device 80A. The heat dissipation die 94 includes a bulk substrate, and may not include devices, metallization layer(s), or the like. The heat dissipation die 94 is formed of a material with high thermal conductivity such as silicon, ceramic, heat conductive glass, a metal such as copper or iron, or the like. In some embodiments, the heat dissipation die 94 is formed of a material that produces a low amount of residue during CMP, such as silicon. The heat dissipation die 94 may also be referred to as a dummy die or as a thermal enhancement die.

In some embodiments, an adhesive layer 92 is used to adhere the heat dissipation die 94 to the first integrated circuit device 80A. The adhesive layer 92 may be a thermal interface material (TIM), a die attach film (DAF), or the like. For example, the adhesive layer 92 may be formed of a TIM such as a polymeric material, solder paste, indium solder paste, or the like, which may be dispensed on the first integrated circuit device 80A and/or the heat dissipation die 94. The heat dissipation die 94 may also be attached to the first integrated circuit device 80A by other techniques.

The adhesive layer 92 (if present) and the heat dissipation die 94 can have several widths. In this embodiment, the adhesive layer 92 and the heat dissipation die 94 have the same width as the first integrated circuit device 80A, so that the outer sidewalls of the first integrated circuit device 80A, the adhesive layer 92, and the heat dissipation die 94 are laterally coterminous. In other embodiments (subsequently described in greater detail), the adhesive layer 92 and the heat dissipation die 94 have a greater or lesser width than the first integrated circuit device 80A.

As will be subsequently described in greater detail, the integrated circuit devices 80 will be encapsulated. When the thickness $T_2$ is greater than the thickness $T_1$, there is a risk of encapsulant remaining in the gap $G_1$ (see FIG. 4) over the first integrated circuit device 80A, which can cause stress concentration, die cracking, and poor heat dissipation efficiency in the integrated circuit package 150. The adhesive layer 92 (if present) and the heat dissipation die 94 fill the gap $G_1$ over the first integrated circuit device 80A so that encapsulant does not remain over the first integrated circuit device 80A after a subsequent thinning process. Specifically, the second integrated circuit devices 80B have a lesser thickness than the combined thickness of the first integrated circuit device 80A, the adhesive layer 92 (if present), and the heat dissipation die 94. For example, the adhesive layer 92 (if present) can have a thickness $T_3$ in the range of 5 μm to 50 μm, and the heat dissipation die 94 can have a thickness $T_4$ in the range of 100 μm to 800 μmm, such that the first integrated circuit device 80A, the adhesive layer 92 (if present), and the heat dissipation die 94 have a combined thickness $T_C$ in the range of 105 μm to 850 μm, with a difference $D_2$ between the combined thickness $T_C$ and the thickness $T_2$ being in the range of 50 μm to 500 μm. Accordingly, the top surfaces of the second integrated circuit devices 80B are disposed closer to the wafer 70 than the top surface of the heat dissipation die 94.

Figure 6:
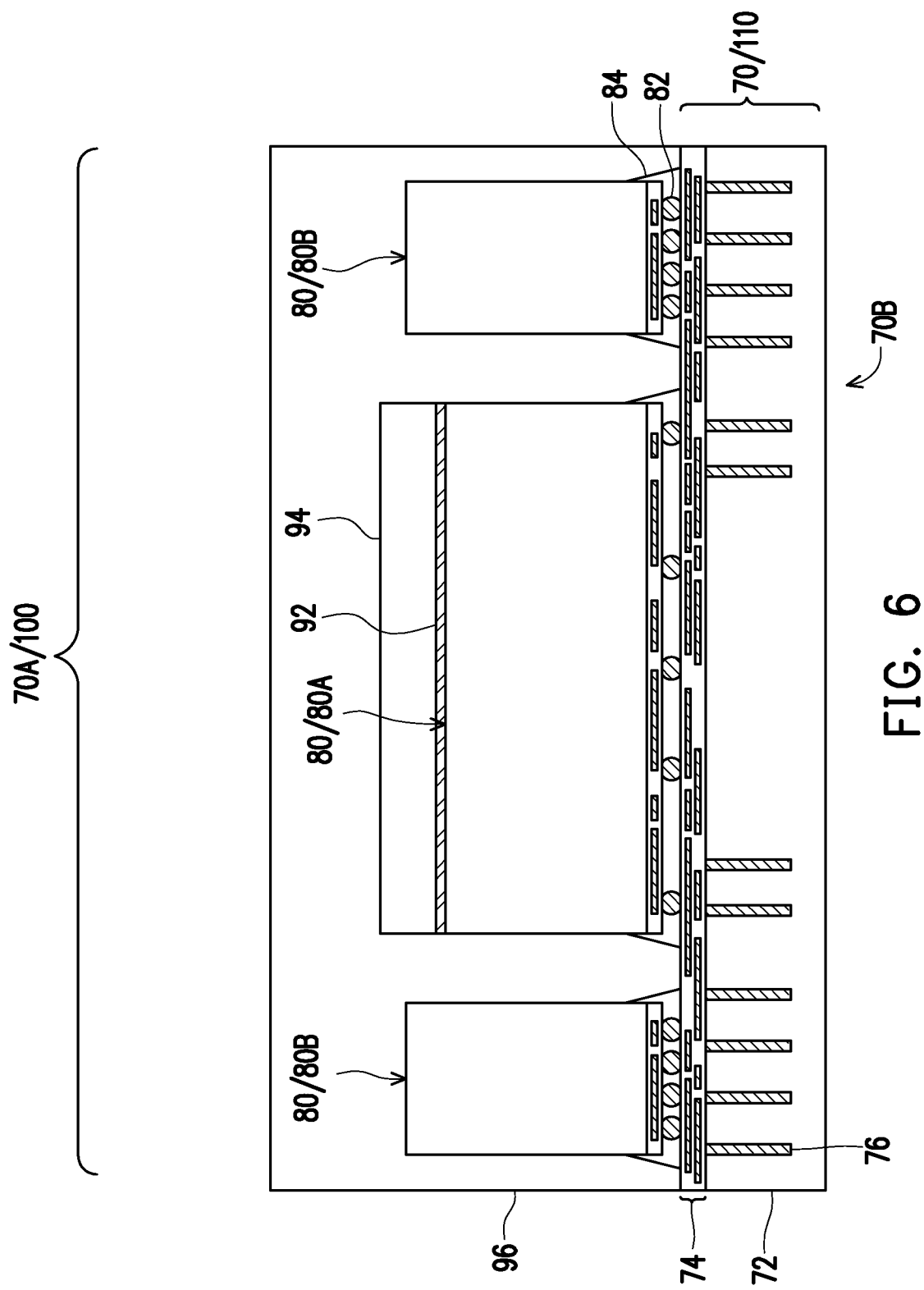

In FIG. 6, an encapsulant 96 is formed on and around the various components. After formation, the encapsulant 96 encapsulates the integrated circuit devices 80, the underfill 84 (if present), the adhesive layer 92 (if present), and the heat dissipation die 94. The encapsulant 96 may be a molding compound, epoxy, or the like. The encapsulant 96 may be applied by compression molding, transfer molding, or the like, and is formed over the wafer 70 such that the heat dissipation die 94 and the integrated circuit devices 80 are buried or covered. The encapsulant 96 is further formed in gap regions between the integrated circuit devices 80 and heat dissipation die 94. Because the adhesive layer 92 (if present) and the heat dissipation die 94 fill the gap $G_1$ (see FIG. 4) over the first integrated circuit device 80A, no encapsulant 96 is formed in the gap $G_1$. The encapsulant 96 may be applied in liquid or semi-liquid form and then subsequently cured.

Figure 7:
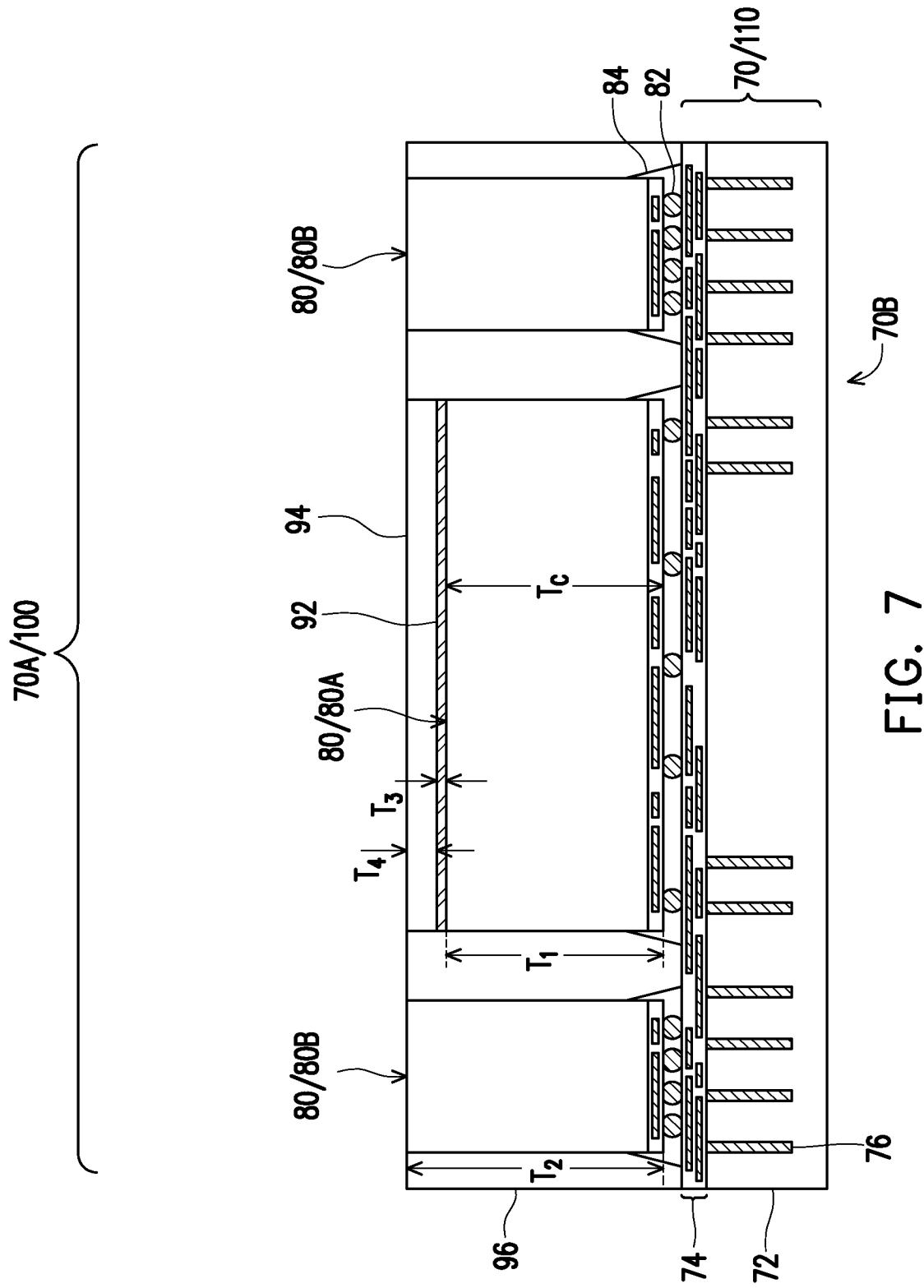

In FIG. 7, the encapsulant 96 is thinned to expose the second integrated circuit devices 80B and the heat dissipation die 94. The thinning process may be a grinding process, a chemical-mechanical polish (CMP), an etch-back, combinations thereof, or the like. After the thinning process, the top surfaces of the second integrated circuit devices 80B, the heat dissipation die 94, and the encapsulant 96 are coplanar (within process variations). The thinning is performed until a desired amount of the second integrated circuit devices 80B, the heat dissipation die 94, and the encapsulant 96 has been removed. Specifically, the thinning removes the portions of the encapsulant 96 covering the top surface of the heat dissipation die 94 until no encapsulant 96 remains over the heat dissipation die 94. Further, the thinning reduces the thickness of the heat dissipation die 94 until the second integrated circuit devices 80B have an equal thickness to the combined thickness of the first integrated circuit device 80A, the adhesive layer 92 (if present), and the heat dissipation die 94. For example, after the thinning, the heat dissipation die 94 can have a thickness $T_4$ in the range of 100 µm to 800 µm, such that the first integrated circuit device 80A, the adhesive layer 92 (if present), and the heat dissipation die 94 have a combined thickness $T_C$ in the range of 300 µm to 1000 µm. The thickness $T_C$ is equal to the thickness $T_2$. Accordingly, the top surfaces of the second integrated circuit devices 80B and the top surface of the heat dissipation die 94 are disposed the same distance from the wafer 70.

Figure 8:
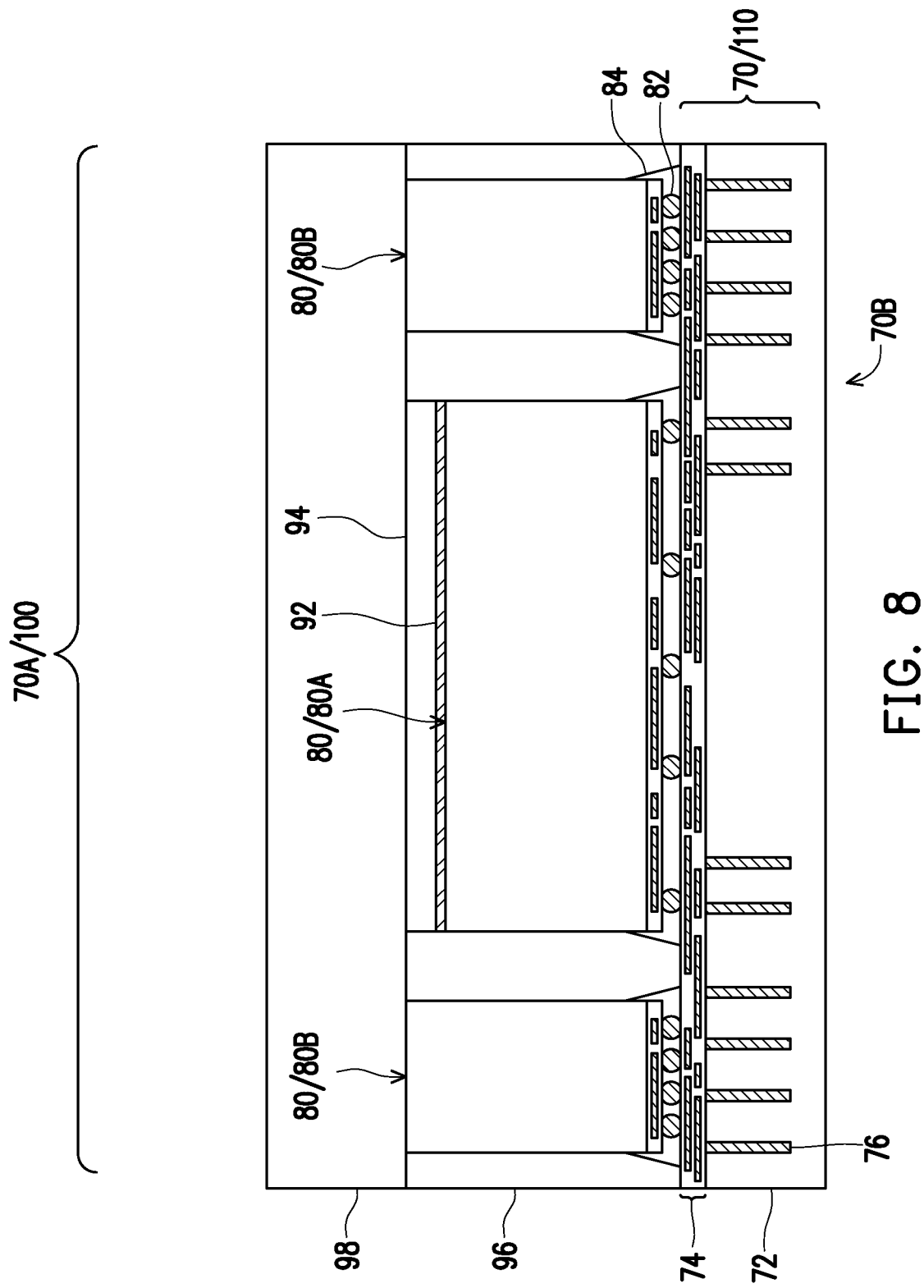

In FIG. 8, the intermediate structure is flipped over (not separately illustrated) to prepare for processing of the back side 70B of the wafer 70. The intermediate structure may be placed on a carrier substrate 98 or other suitable support structure for subsequent processing. For example, the carrier substrate 98 may be attached to the encapsulant 96, the heat dissipation die 94, and the second integrated circuit devices 80B. The carrier substrate 98 may be attached to the encapsulant 96, the heat dissipation die 94, and the second integrated circuit devices 80B by a release layer. The release layer may be formed of a polymer-based material, which may be removed along with the carrier substrate 98 from the structure after processing. In some embodiments, the carrier substrate 98 is a substrate such as a bulk semiconductor or a glass substrate. In some embodiments, the release layer is an epoxy-based thermal-release material, which loses its adhesive property when heated, such as a light-to-heat-conversion (LTHC) release coating.

Figure 9:
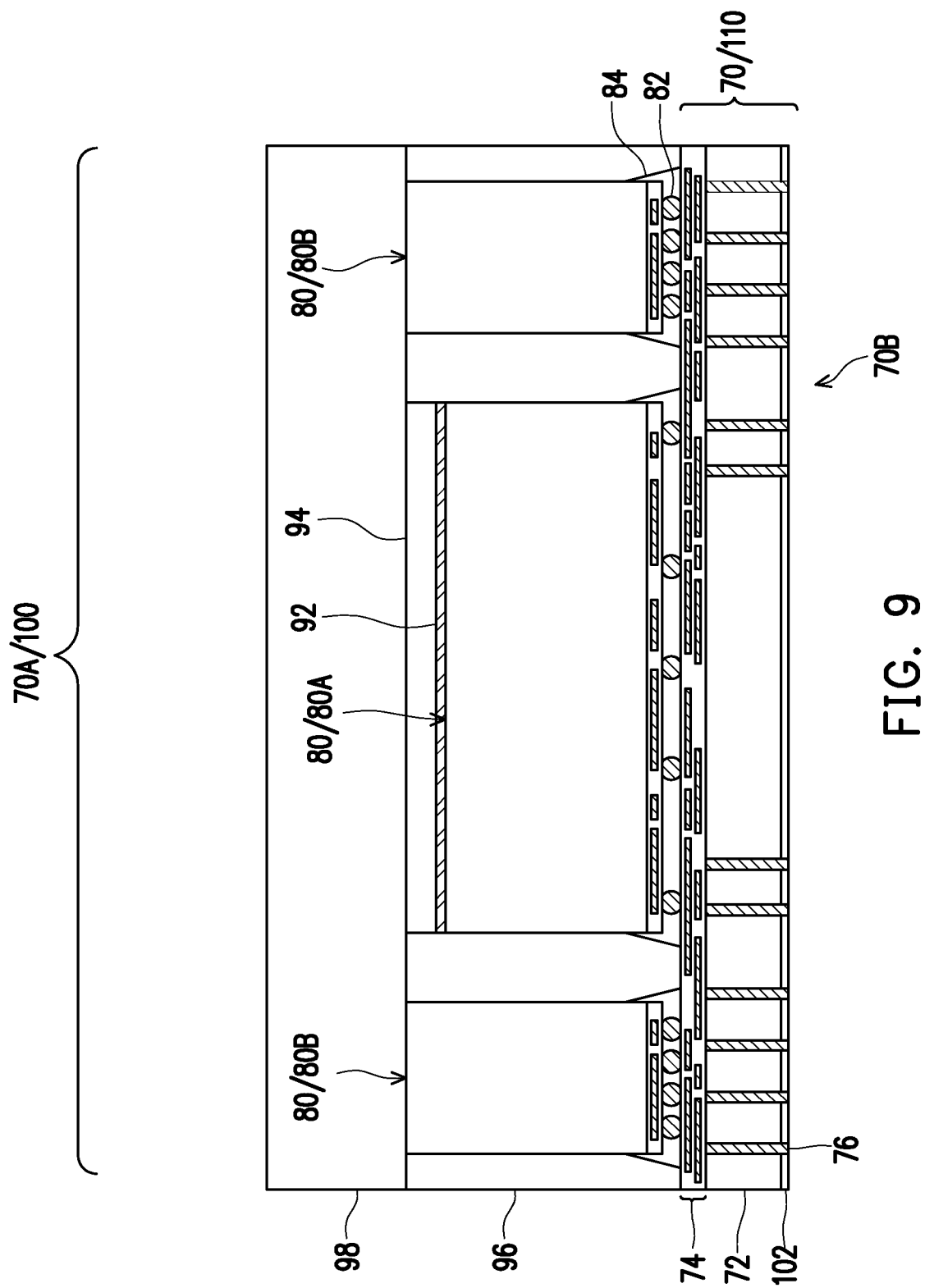

In FIG. 9, the substrate 72 is thinned to expose the conductive vias 76. Exposure of the conductive vias 76 may be accomplished by a thinning process, such as a grinding process, a chemical-mechanical polish (CMP), an etch-back, combinations thereof, or the like. In the illustrated embodiment, a recessing process is performed to recess the back surface of the substrate 72 such that the conductive vias 76 protrude at the back side 70B of the wafer 70. The recessing process may be, e.g., a suitable etch-back process, chemical-mechanical polish (CMP), or the like. In some embodiments, the thinning process for exposing the conductive vias 76 includes a CMP, and the conductive vias 76 protrude at the back side 70B of the wafer 70 as a result of dishing that occurs during the CMP. An insulating layer 102 is optionally formed on the back surface of the substrate 72, surrounding the protruding portions of the conductive vias 76. In some embodiments, the insulating layer 102 is formed of a silicon-containing insulator, such as, silicon nitride, silicon oxide, silicon oxynitride, or the like, and may be formed by a suitable deposition method such as spin coating, CVD, plasma-enhanced CVD (PECVD), high density plasma CVD (HDP-CVD), or the like. Initially, the insulating layer 102 may bury the conductive vias 76. A removal process can be applied to the various layers to remove excess materials over the conductive vias 76. The removal process may be a planarization process such as a chemical mechanical polish (CMP), an etch-back, combinations thereof, or the like.

After planarization, the exposed surfaces of the conductive vias 76 and the insulating layer 102 are coplanar (within process variations) and are exposed at the back side 70B of the wafer 70. In another embodiment, the insulating layer 102 is omitted, and the exposed surfaces of the substrate 72 and the conductive vias 76 are coplanar (within process variations).

Figure 10:
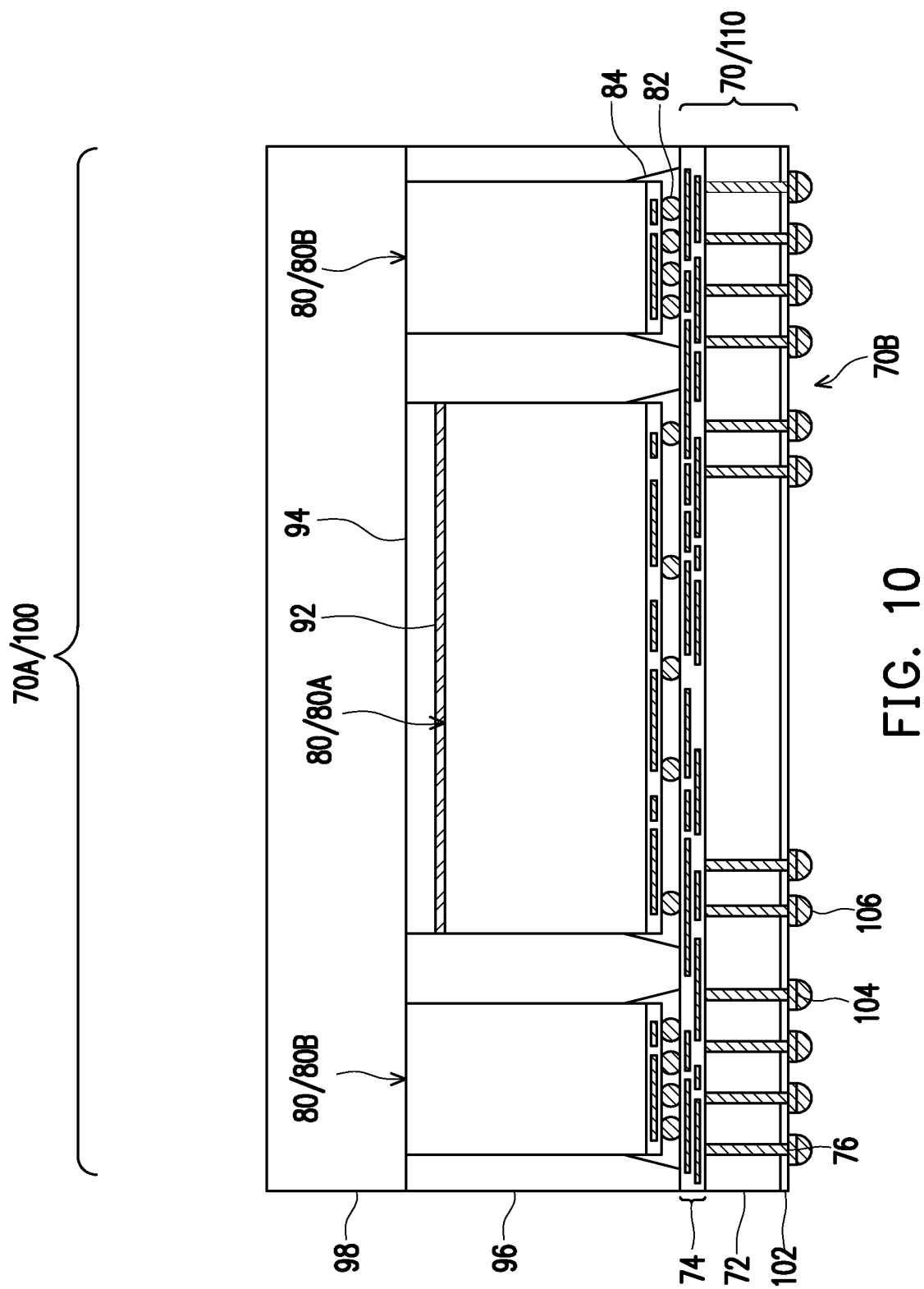

In FIG. 10, under bump metallurgies (UBMs) 104 are formed on the exposed surfaces of the conductive vias 76 and the insulating layer 102 (or the substrate 72, when the insulating layer 102 is omitted). As an example to form the UBMs 104, a seed layer (not separately illustrated) is formed over the exposed surfaces of the conductive vias 76 and the insulating layer 102 (if present) or the substrate 72. In some embodiments, the seed layer is a metal layer, which may be a single layer or a composite layer including a plurality of sub-layers formed of different materials. In some embodiments, the seed layer includes a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 104. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may include a metal, such as copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process. The remaining portions of the seed layer and conductive material form the UBMs 104.

Further, conductive connectors 106 are formed on the UBMs 104. The conductive connectors 106 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 106 may be formed of a conductive material that is reflowable, such as solder, copper, aluminum, gold, nickel, silver, palladium, tin, the like, or a combination thereof. In some embodiments, the conductive connectors 106 are formed by initially forming a layer of solder through evaporation, electroplating, printing, solder transfer, ball placement, or the like. Once a layer of solder has been formed on the structure, a reflow may be performed in order to shape the material into desired bump shapes. In another embodiment, the conductive connectors 106 comprise metal pillars (such as copper pillars) formed by sputtering, printing, electro plating, electroless plating, CVD, or the like. The metal pillars may be solder-free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 11:
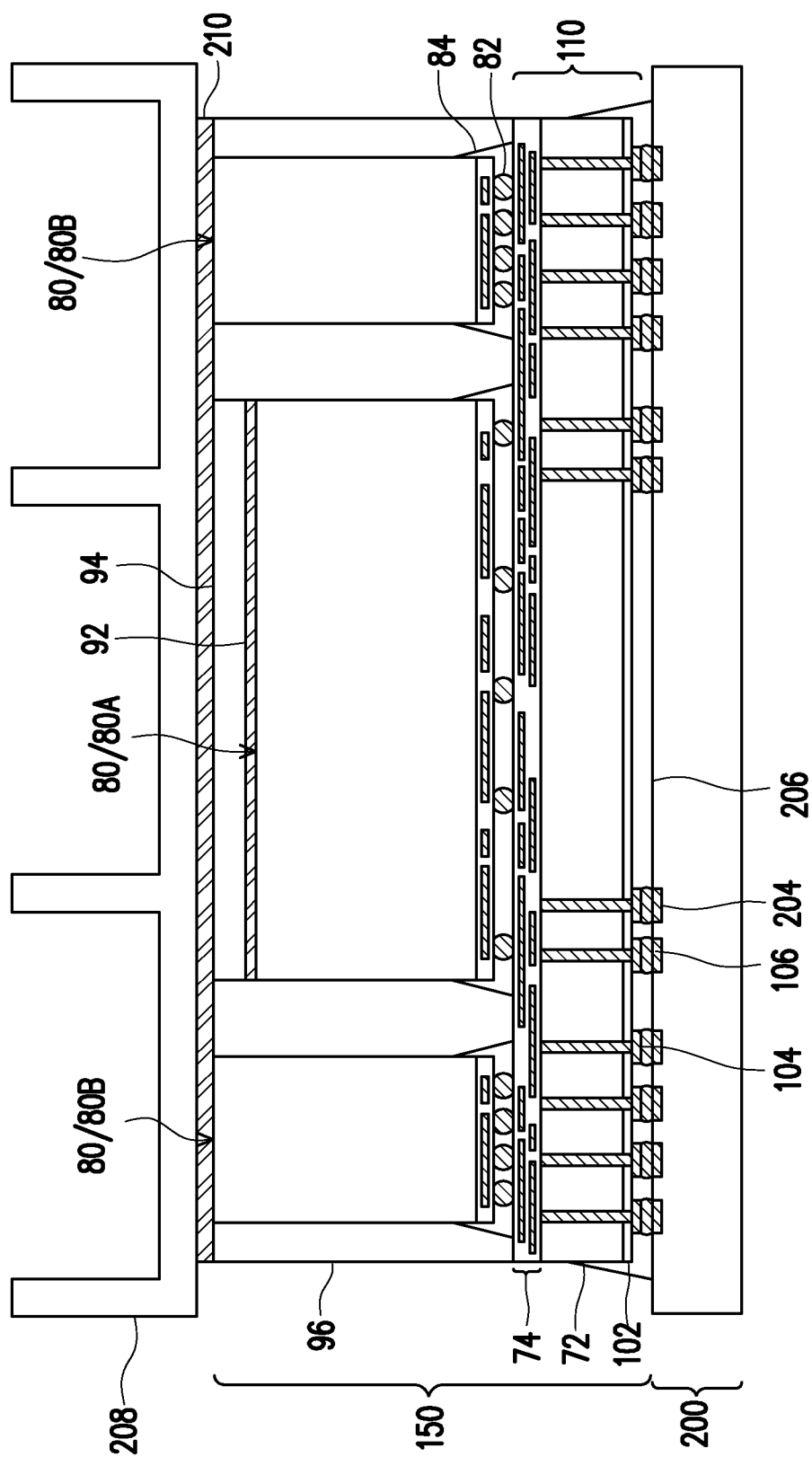

In FIG. 11, a carrier debonding is performed to detach (debond) the carrier substrate 98 from the encapsulant 96, the heat dissipation die 94, and the second integrated circuit devices 80B. In embodiments where the carrier substrate 98 is attached to the encapsulant 96, the heat dissipation die 94, and the second integrated circuit devices 80B by a release layer, the debonding includes projecting a light such as a laser light or an ultraviolet (UV) light on the release layer so that the release layer decomposes under the heat of the light and the carrier substrate 98 can be removed. The structure is then flipped over and placed on a tape (not separately illustrated).

Further, a singulation process is performed by cutting along scribe line regions, e.g., around the package region 70A. The singulation process may include sawing, dicing, or the like. For example, the singulation process can include sawing the insulating layer 102, the encapsulant 96, the interconnect structure 74, and the substrate 72. The singulation process singulates the package region 70A from adjacent package regions. The resulting, singulated integrated circuit package 150 is from the package region 70A. The singulation process forms interposers 110 from the singulated portions of the wafer 70. As a result of the singulation process, the outer sidewalls of the interposer 110 and the encapsulant 96 are laterally coterminous (within process variations).

The integrated circuit package 150 is then flipped and attached to a package substrate 200 using the conductive connectors 106. The package substrate 200 includes a substrate core 202, which may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations thereof, or the like, may also be used. Additionally, the substrate core 202 may be a SOI substrate. Generally, an SOI substrate includes a layer of a semiconductor material such as epitaxial silicon, germanium, silicon germanium, SOI, SGOI, or combinations thereof. The substrate core 202 is, in one alternative embodiment, an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate core 202.

The substrate core 202 may include active and passive devices (not separately illustrated). Devices such as transistors, capacitors, resistors, combinations thereof, and the like may be used to generate the structural and functional requirements of the design for the system. The devices may be formed using any suitable methods.

The substrate core 202 may also include metallization layers and vias (not separately illustrated) and bond pads 204 over the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material, and may be formed through any suitable process (such as deposition, damascene, dual damascene, or the like). In some embodiments, the substrate core 202 is substantially free of active and passive devices.

The conductive connectors 106 are reflowed to attach the UBMs 104 to the bond pads 204. The conductive connectors 106 connect the integrated circuit package 150, including metallization layers of the interconnect structure 74, to the package substrate 200, including metallization layers in the substrate core 202. Thus, the package substrate 200 is electrically connected to the integrated circuit devices 80. In some embodiments, passive devices (e.g., surface mount devices (SMDs), not separately illustrated) may be attached to the integrated circuit package 150 (e.g., bonded to the UBMs 104) prior to mounting on the package substrate 200. In such embodiments, the passive devices may be bonded to a same surface of the integrated circuit package 150 as the conductive connectors 106. In some embodiments, passive devices (e.g., SMDs, not separately illustrated) may be attached to the package substrate 200, e.g., to the bond pads 204.

In some embodiments, an underfill 206 is formed between the integrated circuit package 150 and the package substrate 200, surrounding the conductive connectors 106 and the UBMs 104. The underfill 206 may be formed by a capillary flow process after the integrated circuit package 150 is attached or may be formed by a suitable deposition method before the integrated circuit package 150 is attached. The underfill 206 may be a continuous material extending from the package substrate 200 to the interposer 110 (e.g., the insulating layer 102).

A heat spreader 208 is attached to the integrated circuit package 150. The heat spreader 208 may be formed of a material with high thermal conductivity such as silicon, ceramic, heat conductive glass, a metal such as copper or iron, or the like. The heat spreader 208 protects the integrated circuit package 150 and forms a thermal pathway to conduct heat from the various components of the integrated circuit package 150 (e.g., the integrated circuit devices 80). The heat spreader 208 is thermally coupled to the top surfaces of the second integrated circuit devices 80B, the heat dissipation die 94, and the encapsulant 96. The heat spreader 208 may be formed of the same material as the heat dissipation die 94, or may include a different material. For example, the heat dissipation die 94 may be formed of silicon and the heat spreader 208 may be formed of copper.

As noted above, the encapsulant 96 is thinned so that the top surface of the heat dissipation die 94 is exposed. By exposing the top surface of the heat dissipation die 94, the heat spreader 208 may be attached to the top surface of the heat dissipation die 94. The heat dissipation die 94 is formed of a material with high thermal conductivity. Specifically, the material of the heat dissipation die 94 has a higher thermal conductivity than the material of the encapsulant 96. The heat dissipation die 94 thus increases thermal conductivity from the first integrated circuit device 80A to the heat spreader 208, as compared to using the encapsulant 96 to conduct heat from the first integrated circuit device 80A to the heat spreader 208.

In some embodiments, an adhesive layer 210 is used to adhere the heat spreader 208 to the integrated circuit package 150. The adhesive layer 210 may be a thermal interface material (TIM), a die attach film (DAF), or the like. For example, the adhesive layer 210 may be formed of a TIM such as a polymeric material, solder paste, indium solder paste, or the like, which may be dispensed on the integrated circuit package 150 (e.g., on the top surfaces of the second integrated circuit devices 80B, the heat dissipation die 94, and the encapsulant 96) and/or the heat spreader 208. The heat spreader 208 may also be attached to the integrated circuit package 150 by other techniques. In the illustrated embodiment, the heat spreader 208 includes fins extending upwardly, away from the integrated circuit package 150. In some embodiments, the heat spreader 208 may have other shapes, such as a flat lid or a box lid with a recess in the bottom of the box lid so that the box lid can cover the integrated circuit package 150.

Figure 12:
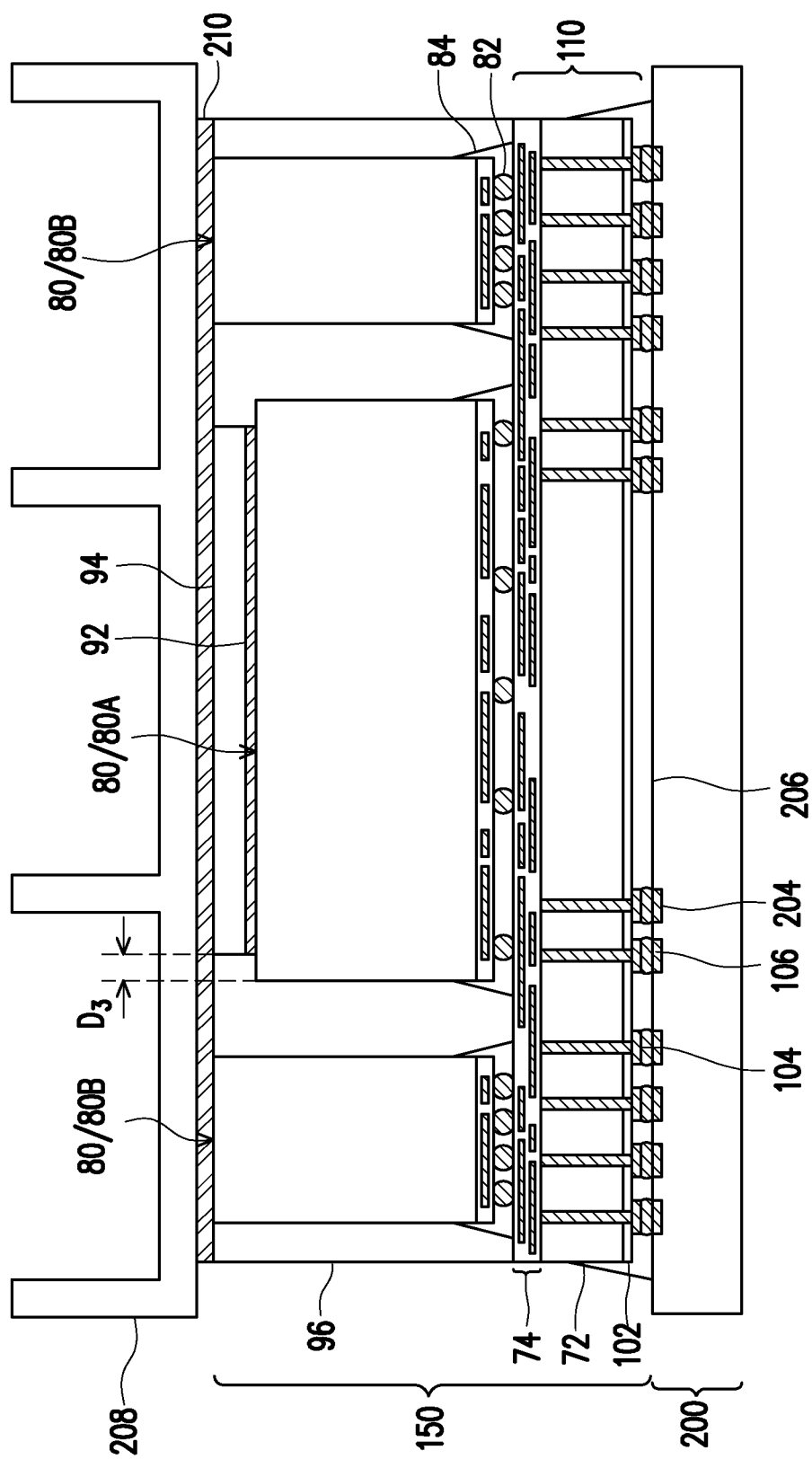
FIGS. 12-15 are cross-sectional views of integrated circuit packages, in accordance with some embodiments.

FIG. 12 is a cross-sectional view of an integrated circuit package, in accordance with some embodiments. This embodiment is similar to the embodiment described for FIG. 11, except the heat dissipation die 94 has a lesser width than the first integrated circuit device 80A. For example, a difference $D_3$ between the width of the first integrated circuit device 80A and the width of the heat dissipation die 94 can be in the range of 1 µm to 5 µm. Thus, some encapsulant 96 remains in the gap $G_1$ (see FIG. 4), although the amount of encapsulant 96 in the gap $G_1$ is less than the amount of encapsulant 96 that would be in the gap $G_1$ absent the heat dissipation die 94. Forming the heat dissipation die 94 to a lesser width than the first integrated circuit device 80A can help avoid die cracking during pressing that may occur during the molding process for forming the encapsulant 96. In the illustrated embodiment, the adhesive layer 92 has a lesser width than the first integrated circuit device 80A, but it should be appreciated that the adhesive layer 92 may also have the same width as the first integrated circuit device 80A, such as in embodiments where the adhesive layer 92 is dispensed on the first integrated circuit device 80A.

Figure 13:
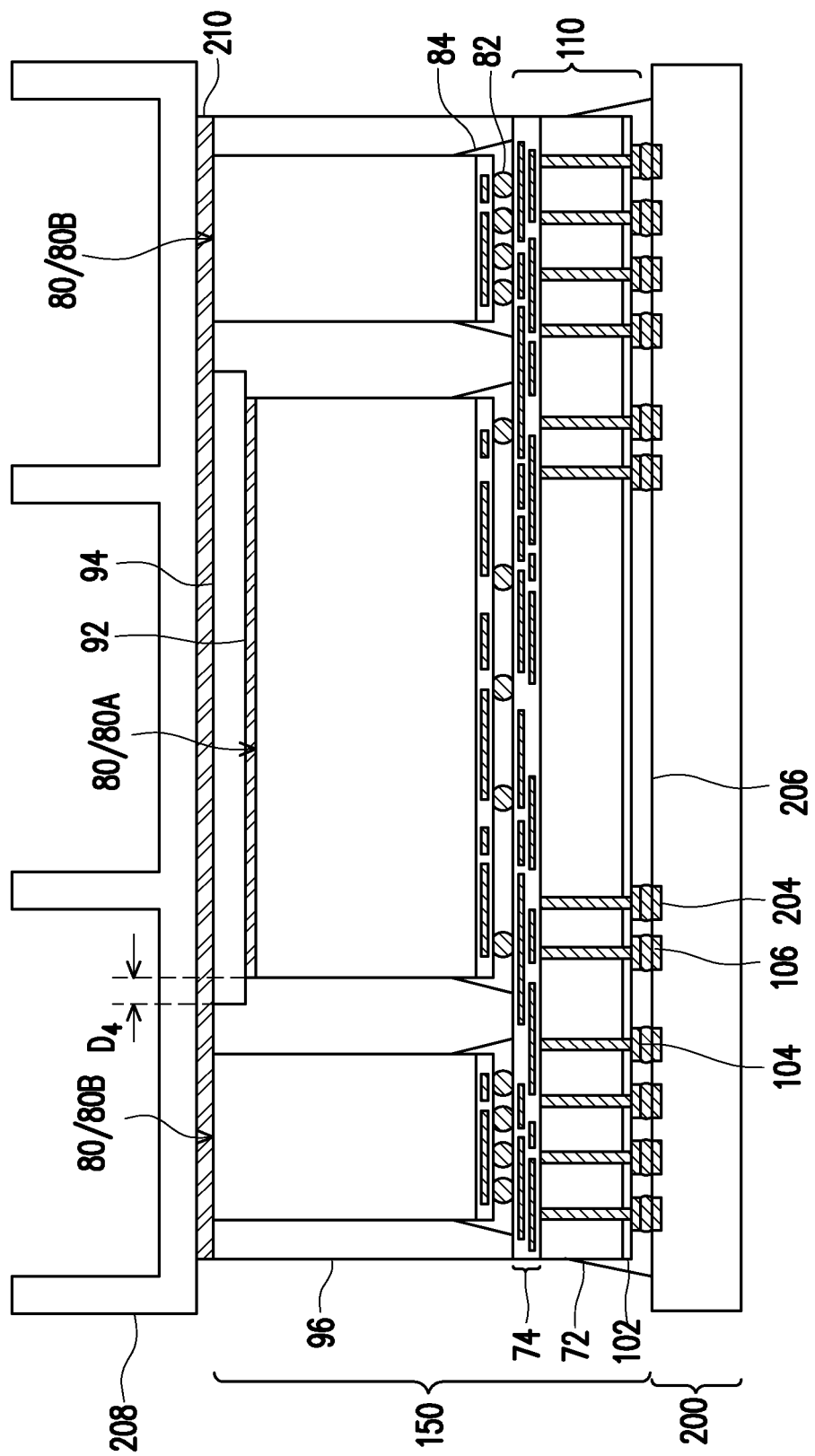

FIG. 13 is a cross-sectional view of an integrated circuit package, in accordance with some embodiments. This embodiment is similar to the embodiment described for FIG. 11, except the heat dissipation die 94 has a greater width than the first integrated circuit device 80A. For example, a difference $D_4$ between the width of the first integrated circuit device 80A and the width of the heat dissipation die 94 can be in the range of 1 µm to 5 µm. Forming the heat dissipation die 94 to a greater width than the first integrated circuit device 80A can help further reduce the amount of encapsulant 96 at the top surface of the integrated circuit package 150, improving heat dissipation. In the illustrated embodiment, the adhesive layer 92 has the same width as the first integrated circuit device 80A, but it should be appreciated that the adhesive layer 92 may also have a greater width than the first integrated circuit device 80A, such as in embodiments where the adhesive layer 92 is dispensed on the heat dissipation die 94.

Figure 14:
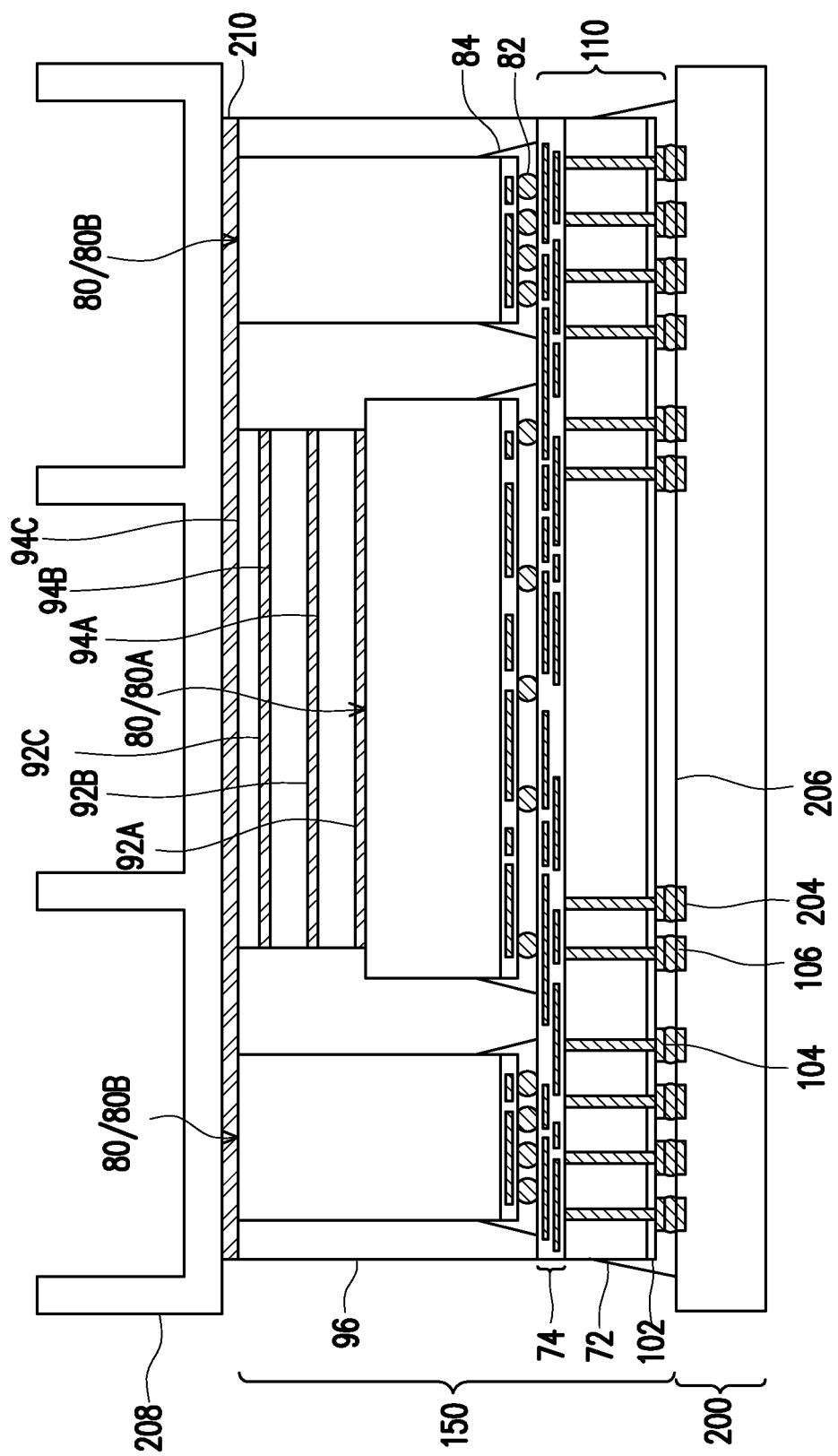

FIG. 14 is a cross-sectional view of an integrated circuit package, in accordance with some embodiments. This embodiment is similar to the embodiments described for FIGS. 11-13, except a stack of heat dissipation dies 94 are attached to the first integrated circuit device 80A. Specifically, multiple heat dissipation dies 94 (e.g., a lower heat dissipation die 94A, a middle heat dissipation die 94B, and an upper heat dissipation die 94C) are stacked on the first integrated circuit device 80A. In some embodiments, adhesive layers 92 (e.g., a first adhesive layer 92A, a second adhesive layer 92B, and a third adhesive layer 92C) are used to adhere each heat dissipation die 94 to the respective underlying heat dissipation die 94 or first integrated circuit device 80A. The quantity of heat dissipation dies 94 may be chosen based on the size of the gap $G_1$ (see FIG. 4) over the first integrated circuit device 80A, with more heat dissipation dies 94 being used to fill a larger gap $G_1$. In the illustrated embodiment, the heat dissipation dies 94 in the stack each have a lesser width than the first integrated circuit device 80A (in a similar manner as described for FIG. 12), but it should be appreciated that the heat dissipation dies 94 in the stack can each have a greater width than the first integrated circuit device 80A (in a similar manner as described for FIG. 13) or the same width as the first integrated circuit device 80A (in a similar manner as described for FIG. 11).

When a stack of heat dissipation dies 94 is attached to the first integrated circuit device 80A, the process for thinning the encapsulant 96 (previously described for FIG. 7) exposes the top surface of the upper heat dissipation die 94C of the stack. Specifically, the thinning removes the encapsulant 96 until no encapsulant 96 remains over the upper heat dissipation die 94C, and may remove some of the upper heat dissipation die 94C. In some embodiments, each of the heat dissipation dies 94 initially has the same thickness, but after the thinning, the upper heat dissipation die 94C has a lesser thickness than the lower heat dissipation die 94A and the middle heat dissipation die 94B (which retain their initial thickness). After the thinning process, the top surfaces of the second integrated circuit devices 80B, the upper heat dissipation die 94C, and the encapsulant 96 are coplanar (within process variations). Accordingly, the top surfaces of the second integrated circuit devices 80B and the top surface of the upper heat dissipation die 94C are disposed the same distance from the wafer 70. The heat spreader 208 may be attached to the top surface of the upper heat dissipation die 94C.

Figure 15:
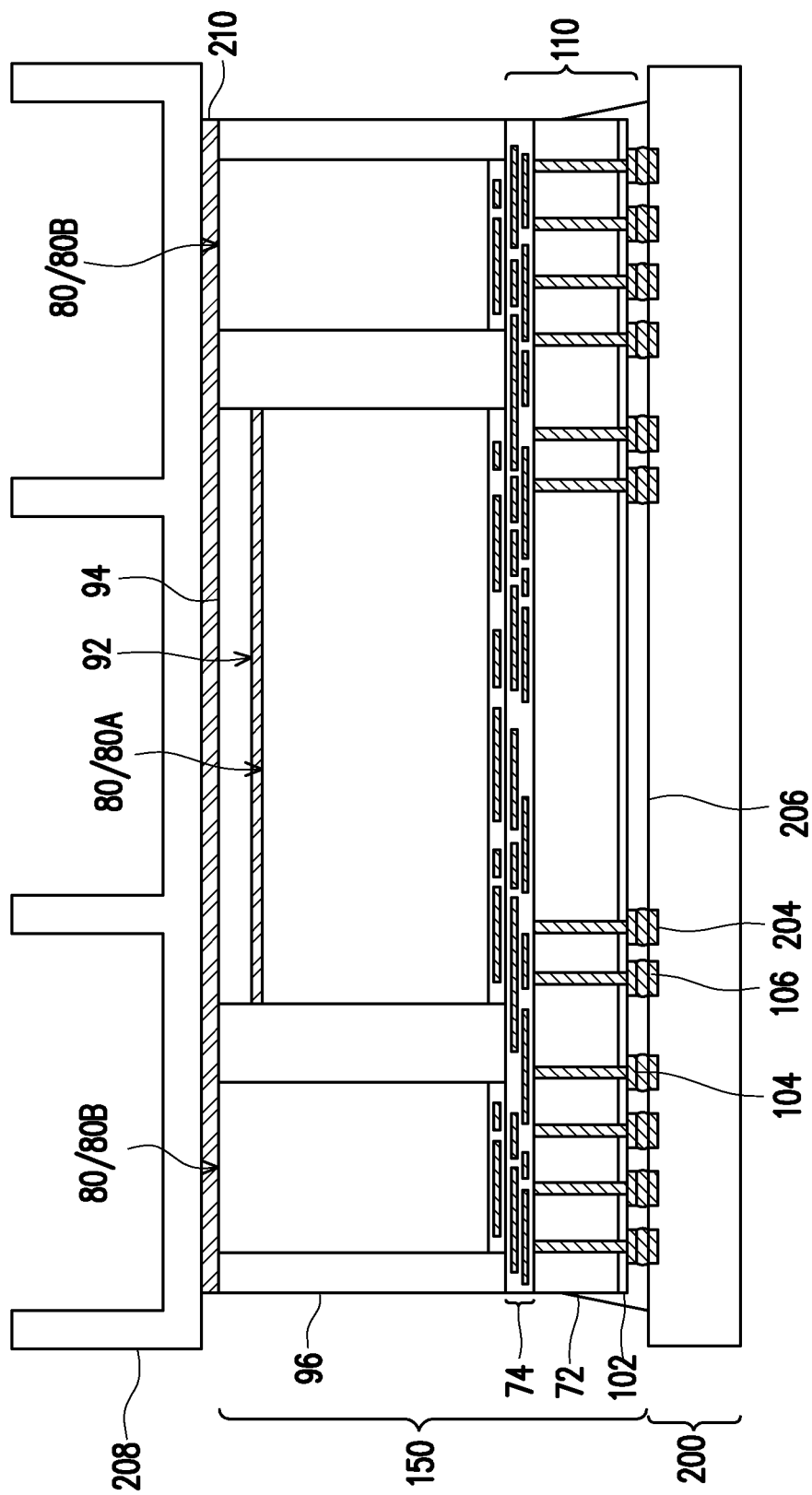

FIG. 15 is a cross-sectional view of an integrated circuit package, in accordance with some embodiments. This embodiment is similar to the embodiment described for FIG. 11, except the integrated circuit devices 80 are attached to the wafer 70 with direct bonds. For example, hybrid bonding, fusion bonding, dielectric bonding, metal bonding, or the like may be used to directly bond corresponding dielectric layers and/or die connectors of the wafer 70 and the integrated circuit devices 80 without the use of adhesive or solder. Although the direct bonding is shown for the embodiment described for FIG. 11, it should be appreciated that direct bonding may also be used in any of the embodiments previously described for FIGS. 12-14, or the embodiments that will be subsequently described for FIGS. 20-23 and 30-33.

FIGS. 16-19 are cross-sectional views of intermediate stages in the manufacturing of a die stack 60A, in accordance with some embodiments. The die stack 60A is formed by bonding integrated circuit dies 50B (having conductive vias 62) to a wafer 300. In an embodiment, the die stack 60A is a system-on-integrated-chip (SoIC) device, although it should be appreciated that embodiments may be applied to other three-dimensional integrated circuit (3DIC) packages. The wafer 300 has a die region 300A, which includes a die formed therein, such as an integrated circuit die 50A (which may not have conductive vias 62). The die region 300A will be singulated in subsequent processing to form the die stack 60A, which includes a singulated portion of the wafer 300 (e.g., an integrated circuit die 50A) and the integrated circuit dies 50B which are bonded to that singulated portion of the wafer 300. As will be subsequently described in greater detail, the die stack 60A may be used as a first integrated circuit device 80A in an integrated circuit package 150.

Processing of one die region 300A of the wafer 300 is illustrated. It should be appreciated that any number of die regions 300A of a wafer 300 can be simultaneously processed and singulated to form multiple die stacks 60A from the singulated portions of the wafer 300.

Figure 16:
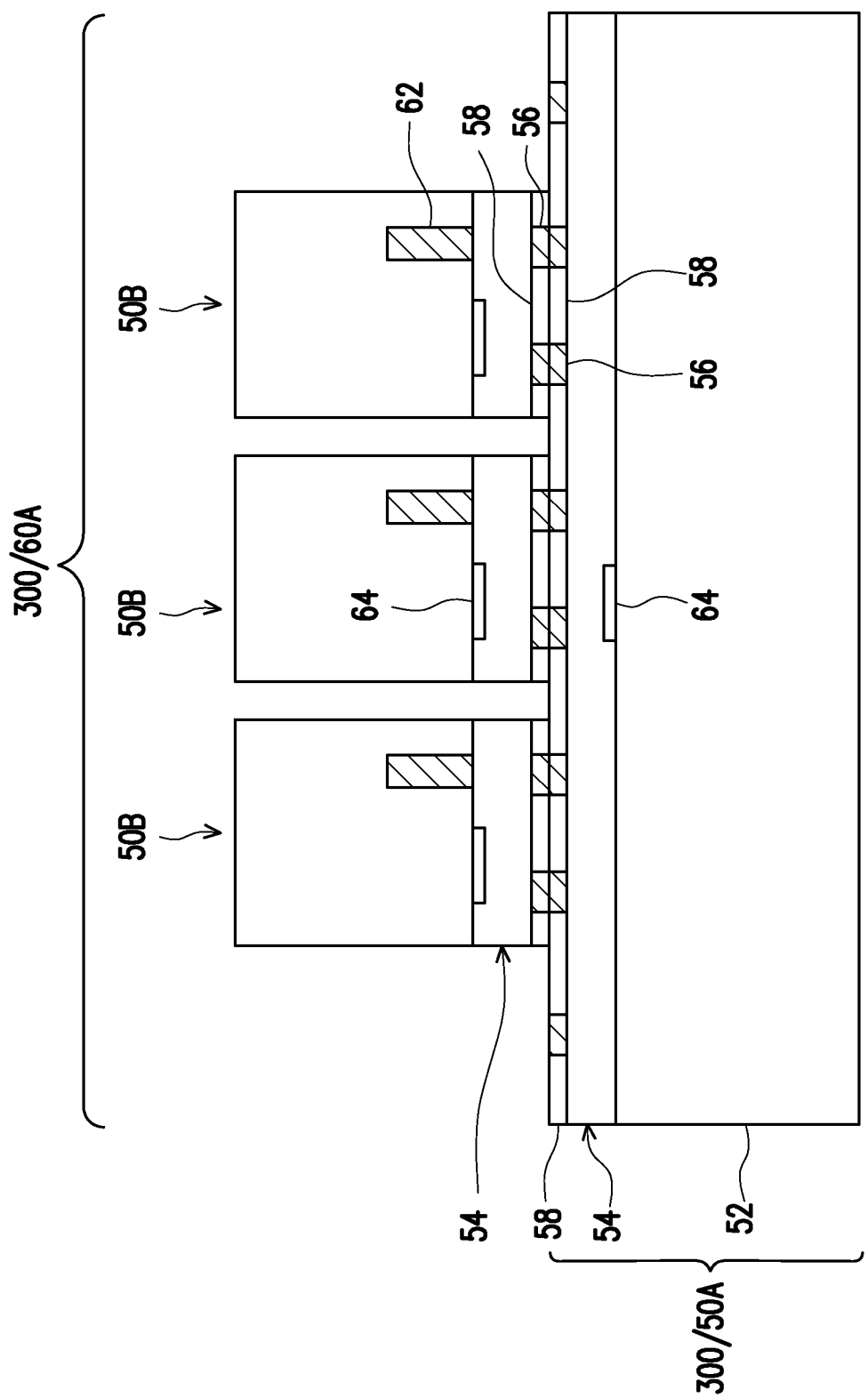
FIGS. 16-19 are cross-sectional views of intermediate stages in the manufacturing of a die stack, in accordance with some embodiments.

In FIG. 16, a wafer 300 is obtained or formed. The wafer 300 comprises devices in the die region 300A, which will be singulated in subsequent processing to be included in the die stack 60A. In some embodiments, integrated circuit dies 50A are formed in the wafer 300, which include a substrate 52, an interconnect structure 54, die connectors 56, and a dielectric layer 58, which are which are similar to those described for FIG. 1.

Integrated circuit dies 50B are attached to the wafer 300 with direct bonds. For example, hybrid bonding, fusion bonding, dielectric bonding, metal bonding, or the like may be used to directly bond corresponding dielectric layers 58 and/or die connectors 56 of the integrated circuit dies 50A, 50B without the use of adhesive or solder. Any desired quantity of integrated circuit dies 50B may be attached to the wafer 300. In some embodiments, the integrated circuit dies 50A, 50B further include alignment marks 64 in their corresponding interconnect structures 54, which may be used to align the integrated circuit dies 50A, 50B during bonding. The integrated circuit dies 50B include conductive vias 62 that extend into the interconnect structure 54 and/or the semiconductor substrate 52. The conductive vias 62 are electrically connected to metallization layer(s) of the interconnect structures 54.

Figure 17:
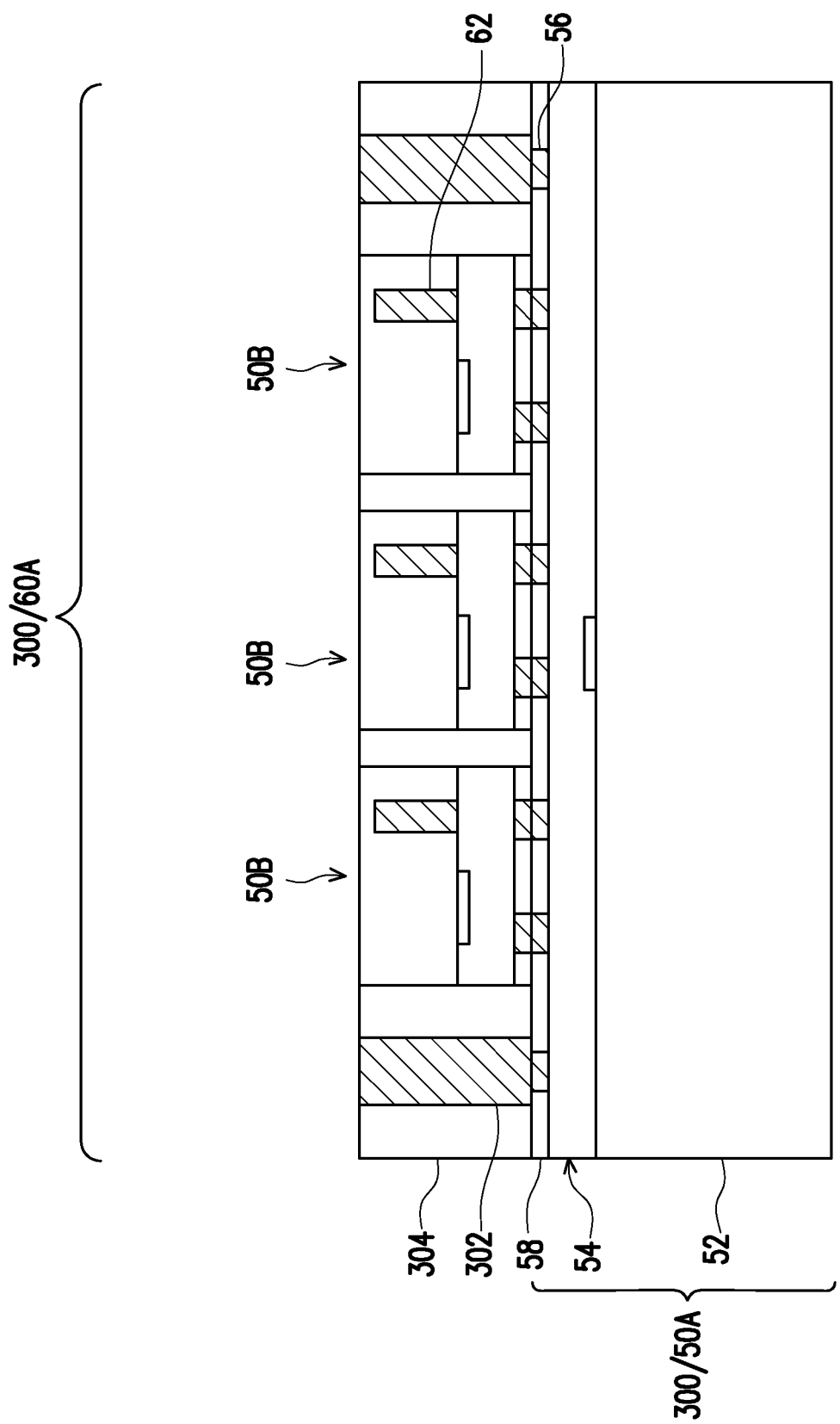

In FIG. 17, conductive vias 302 are optionally formed on the wafer 300, e.g., on the die connectors 56. The conductive vias 302 are electrically connected to the integrated circuit die 50A. As an example to form the conductive vias 302, a seed layer is formed over the wafer 300. In some embodiments, the seed layer is a metal layer, which may be a single layer or a composite layer comprising a plurality of sub-layers formed of different materials. In some embodiments, the seed layer includes a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to the conductive vias 302. The patterning forms openings through the photoresist to expose the seed layer. A conductive layer is then formed in the openings of the first photoresist and on the exposed portions of the seed layer. The conductive layer may be formed by plating, such as electroless plating or electroplating from the seed layer, or the like. The conductive layer may be formed of copper, titanium, tungsten, aluminum, or the like. The photoresist and portions of the seed layer on which the metal layer is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and metal layer form the conductive vias 302.

An encapsulant 304 is formed on and around the various components. After formation, the encapsulant 304 encapsulates the conductive vias 302 (if present) and the integrated circuit dies 50B. The encapsulant 304 may be a molding compound, epoxy, or the like. The encapsulant 304 may be applied by compression molding, transfer molding, or the like, and may be formed over the wafer 300 such that the conductive vias 302 (if present) and the integrated circuit dies 50B are buried or covered. The encapsulant 304 is further formed in gap regions between the conductive vias 302 (if present) and the integrated circuit dies 50B. The encapsulant 304 may be applied in liquid or semi-liquid form and then subsequently cured. The encapsulant 304 is optionally thinned to expose the conductive vias 302 (if present) and the integrated circuit dies 50B. The thinning process may be a grinding process, a chemical-mechanical polish (CMP), an etch-back, combinations thereof, or the like. After the thinning process, the top surfaces of the encapsulant 304, the conductive vias 302 (if present), and the integrated circuit dies 50B are coplanar (within process variations). The thinning is performed until a desired amount of the encapsulant 304, the conductive vias 302 (if present), and the integrated circuit dies 50B has been removed. The thinning of the encapsulant 304 may be omitted, for example, if the conductive vias 302 (if present) and the integrated circuit dies 50B are already exposed.

Figure 18:
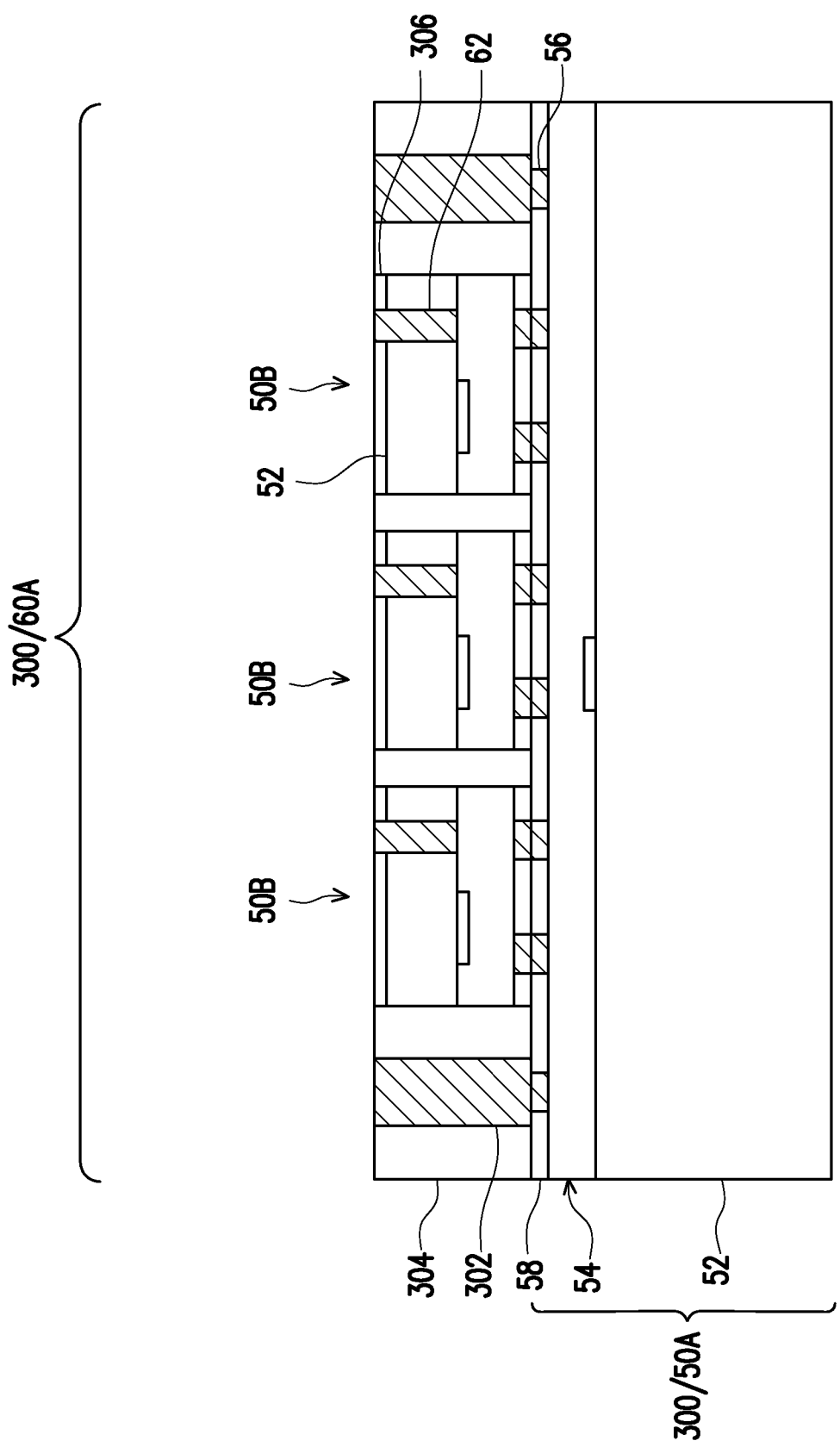

In FIG. 18, the encapsulant 304 and the semiconductor substrate 52 of the integrated circuit dies 50B are ground to expose the conductive vias 62. One or more removal process(es) can be performed, which also exposes the conductive vias 302 if they are not already exposed. The removal process may be a planarization process such as a chemical mechanical polish (CMP), a grinding process, an etch-back, combinations thereof, or the like. In some embodiments, the removal process is performed to thin the semiconductor substrate 52 of the integrated circuit dies 50B and expose the conductive vias 62. Barrier layers 306 can optionally be formed around the conductive vias 62. The barrier layers 306 can help electrically isolate the conductive vias 62 from one another, thus avoiding shorting. As an example to form the barrier layers 306, the semiconductor substrate 52 of the integrated circuit dies 50B can be recessed to expose sidewall portions of the conductive vias 62. The recessing may be by an etching process, such as a dry etch. A barrier material can then be formed in the recesses. The barrier material can be a dielectric material such as a low temperature polyimide material, although any other suitable dielectric material, such as PBO, an encapsulant, combinations thereof, or the like may also be utilized. A planarization process, such as a CMP, grinding, or etch-back, can be performed to remove excess portions of the barrier material over the semiconductor substrate 52 of the integrated circuit dies 50B. The remaining portions of the barrier material in the recesses form the barrier layers 306. After the barrier layers 306 are formed, they are laterally surrounded by the encapsulant 304. The top surfaces of the conductive vias 302 (if present), the encapsulant 304, the barrier layers 306 (if present), and the conductive vias 62 are coplanar (within process variations).

Figure 19:
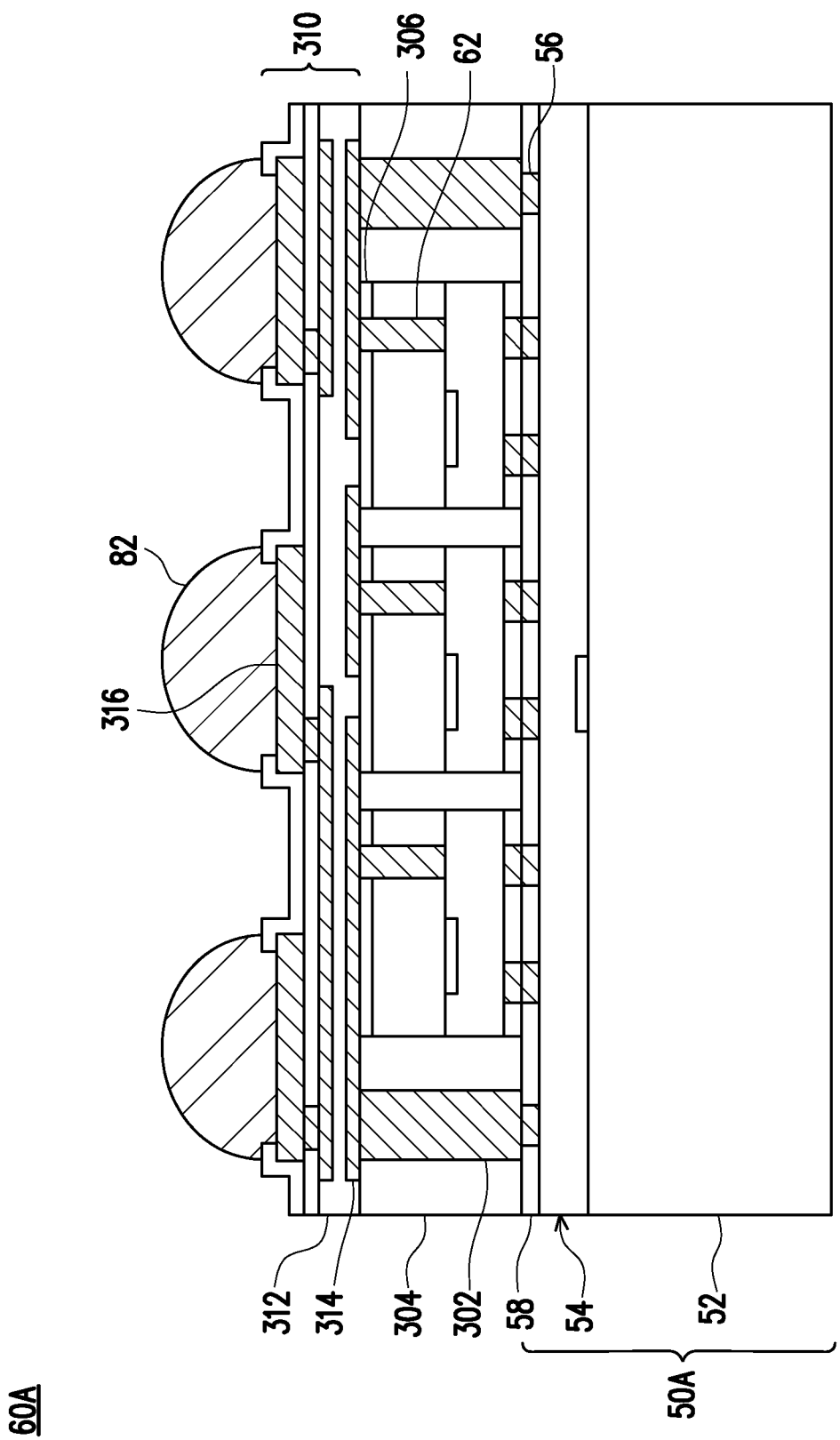
Figure 20:
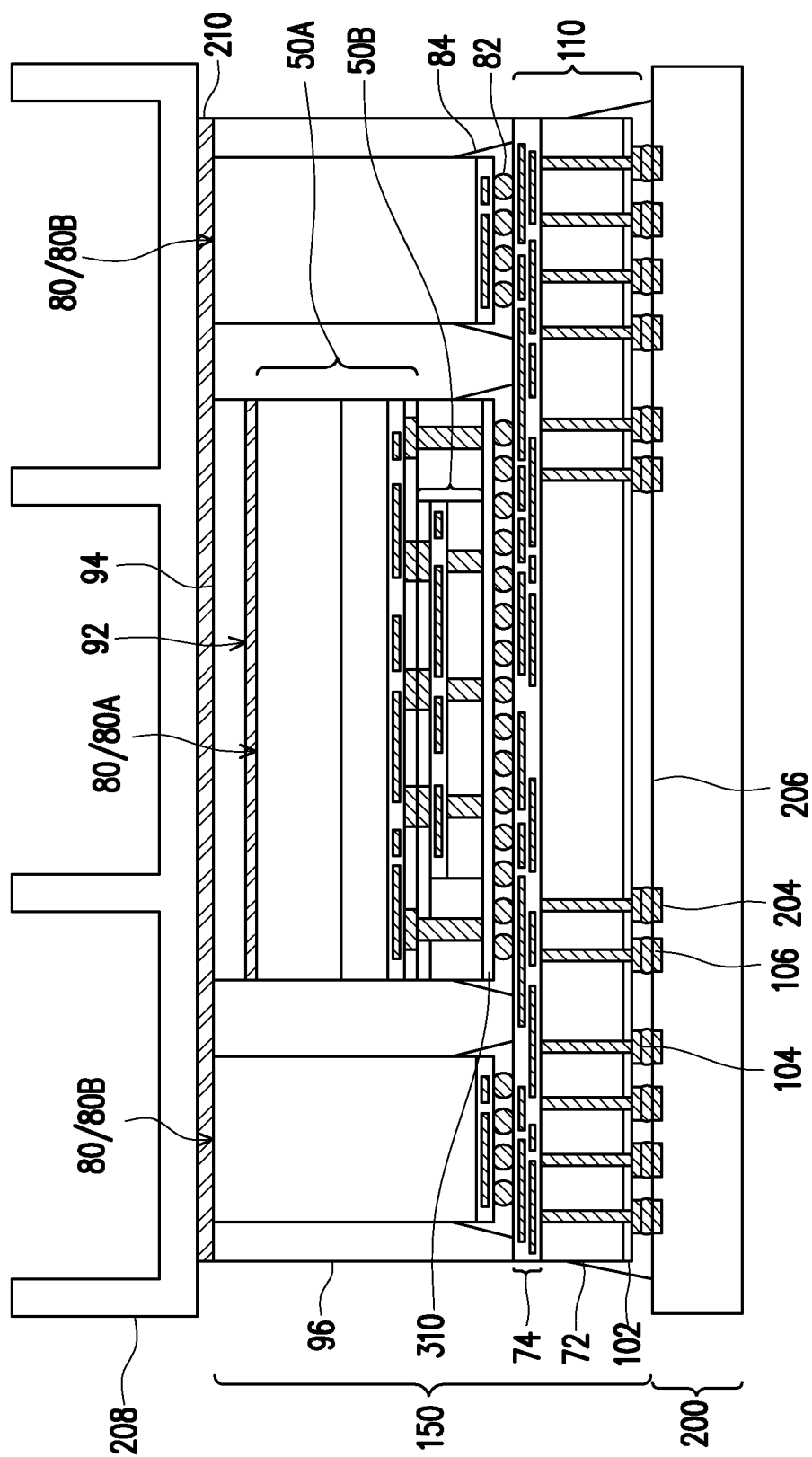
FIGS. 20-23 are cross-sectional views of integrated circuit packages, in accordance with some embodiments.
Figure 21:
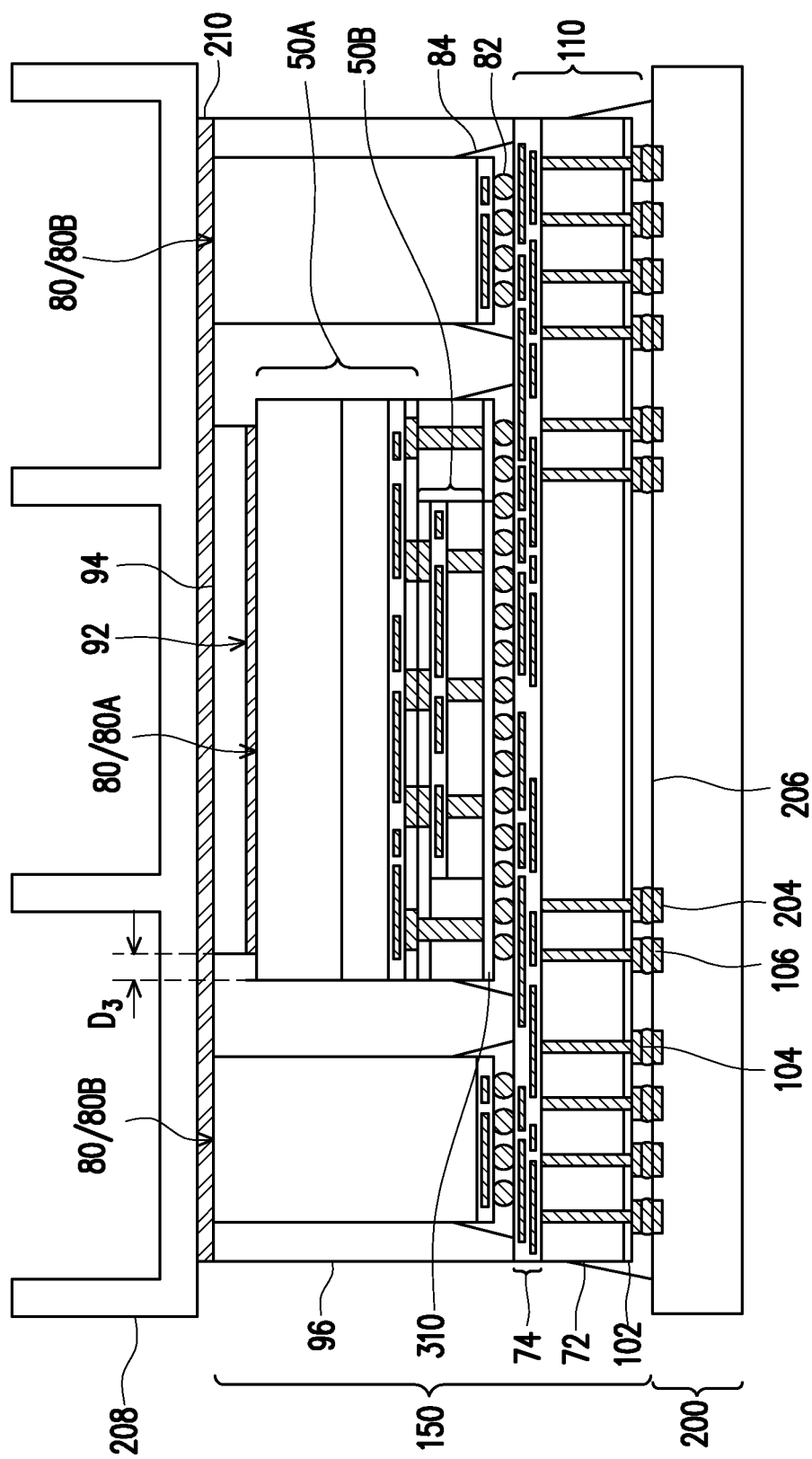
Figure 22:
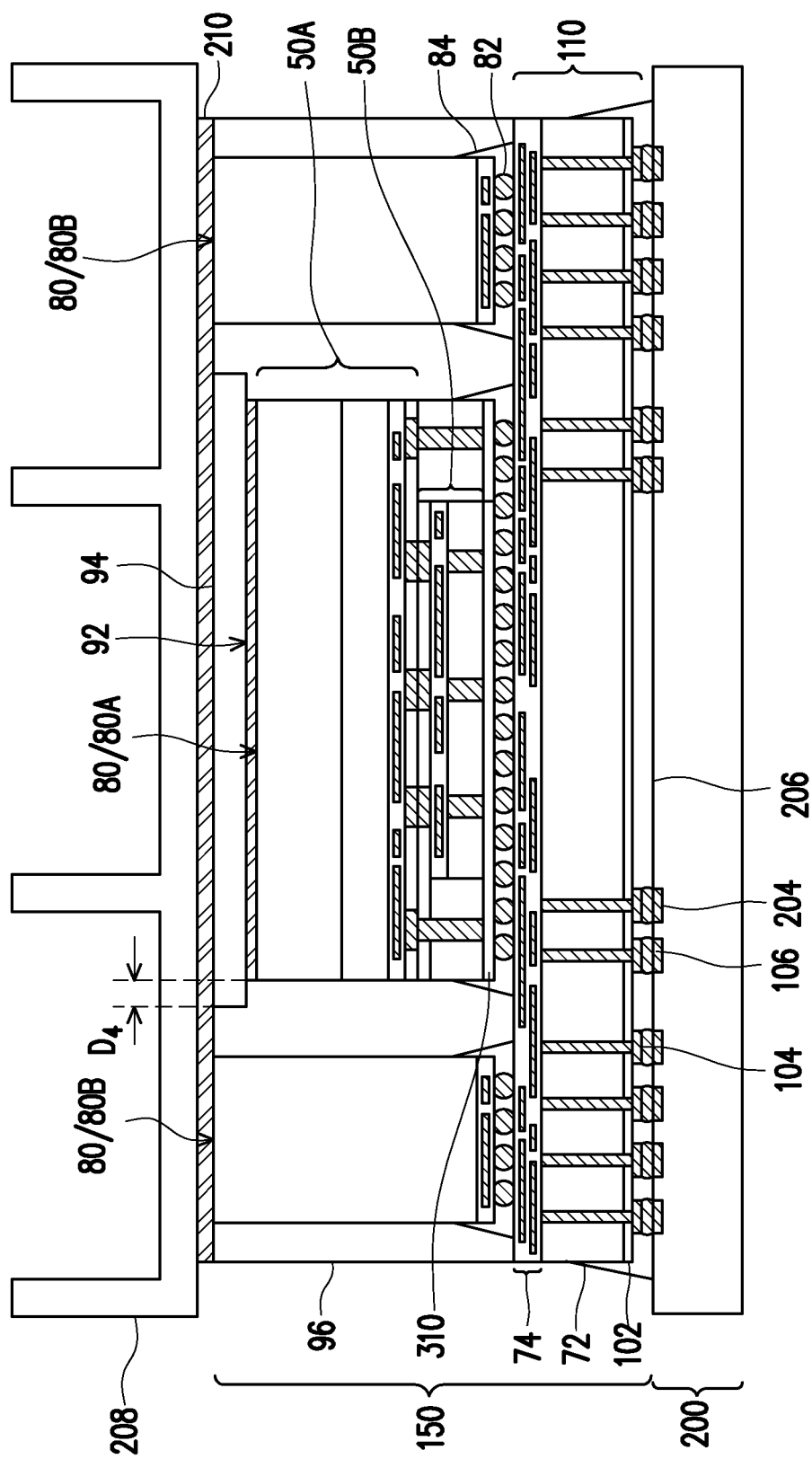
Figure 23:
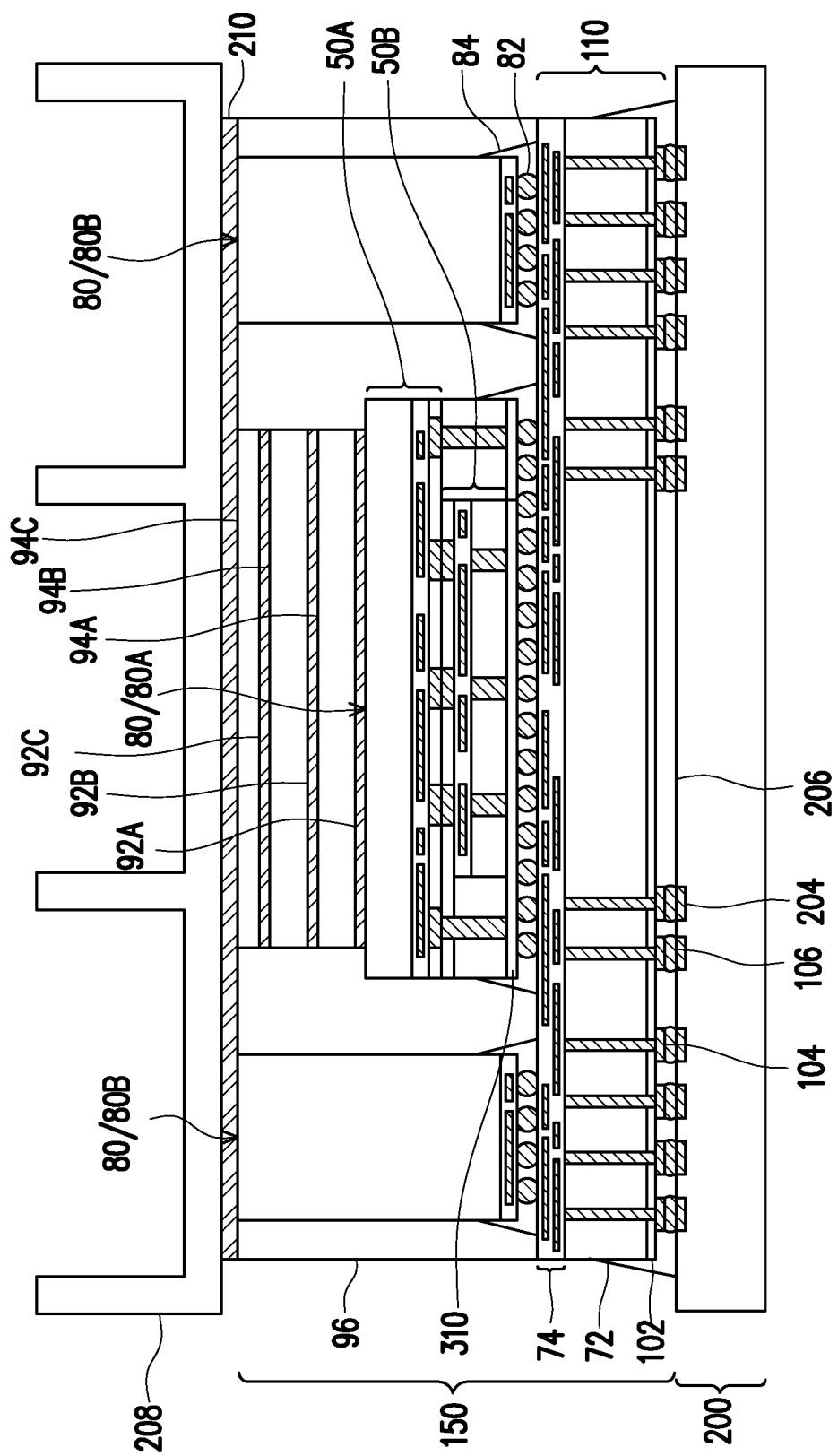

In FIG. 19, a redistribution structure 310 is formed on the top surfaces of the conductive vias 302 (if present), the encapsulant 304, the barrier layers 306 (if present), and the conductive vias 62. The redistribution structure 310 includes dielectric layers 312 and metallization layers 314 (sometimes referred to as redistribution layers or redistribution lines) among the dielectric layers 312. For example, the redistribution structure 310 may include a plurality of metallization layers 314 separated from each other by respective dielectric layers 312. The metallization layers 314 of the redistribution structure 310 are connected to the conductive vias 302 (if present) and the conductive vias 62. Specifically, the metallization layers 314 are connected to the integrated circuit dies 50A, 50B by the conductive vias 302 (if present) and the conductive vias 62.

In some embodiments, the dielectric layers 312 are formed of a polymer, which may be a photosensitive material such as PBO, polyimide, a BCB-based polymer, or the like, and may be patterned using a lithography mask. In other embodiments, the dielectric layers 312 are formed of a nitride such as silicon nitride; an oxide such as silicon oxide, PSG, BSG, BPSG; or the like. The dielectric layers 312 may be formed by spin coating, lamination, CVD, the like, or a combination thereof. After each dielectric layer 312 is formed, it is then patterned to expose underlying conductive features, such as portions of the underlying conductive vias 62, conductive vias 302, or metallization layers 314. The patterning may be by an acceptable process, such as by exposing the dielectrics layers to light when the dielectric layers 312 are a photosensitive material, or by etching using, for example, an anisotropic etch. If the dielectric layers 312 are photosensitive materials, the dielectric layers 312 can be developed after the exposure.

The metallization layers 314 each include conductive vias and/or conductive lines. The conductive vias extend through the dielectric layers 312, and the conductive lines extend along the dielectric layers 312. As an example to form a metallization layer, a seed layer (not separately illustrated) is formed over the respective underlying features. For example, the seed layer can be formed on a respective dielectric layer 312 and in the openings through the respective dielectric layer 312, or can be formed on the underlying conductive vias 302 (if present) or the underlying conductive vias 62. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using a deposition process, such as PVD or the like. A photoresist is then formed and patterned on the seed layer. The photoresist may be formed by spin coating or the like and may be exposed to light for patterning. The pattern of the photoresist corresponds to the metallization layer. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal or a metal alloy, such as copper, titanium, tungsten, aluminum, the like, or combinations thereof. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization layer.

The redistribution structure 310 is illustrated as an example. More or fewer dielectric layers 312 and metallization layers 314 than illustrated may be formed in the redistribution structure 310 by repeating or omitting the steps previously described.

The conductive connectors 82 (previously described) are formed on the redistribution structure 310. The conductive connectors 82 may be connected to metallization layers 314 of the redistribution structure 310. For example, the conductive connectors 82 may be formed on under-bump metallizations (UBMs) 316 of the redistribution structure 310.

A singulation process is performed by cutting along scribe line regions, e.g., around the die region 300A. The singulation process may include sawing, dicing, or the like. For example, the singulation process can include sawing the redistribution structure 310, the encapsulant 304, and the wafer 300. The singulation process singulates the die region 300A from adjacent die regions. The resulting, singulated die stack 60A is from the die region 300A. The singulation process forms integrated circuit dies 50A from the singulated portions of the wafer 300. As a result of the singulation process, the outer sidewalls of the redistribution structure 310, the encapsulant 304, and the integrated circuit die 50A are laterally coterminous (within process variations). The integrated circuit dies 50B each have a lesser width than the integrated circuit die 50A.

FIGS. 20, 21, 22, and 23 are cross-sectional views of integrated circuit packages, in accordance with some embodiments. These embodiments are similar to the embodiments described for FIGS. 11, 12, 13, and 14, except the first integrated circuit device 80A is a similar die stack 60A as that described for FIGS. 16-19. Some features of the die stack 60A are omitted for illustration clarity. In these embodiments, the redistribution structure 310 of the die stack 60A is attached to the interposer 110 with solder bonds, e.g., the conductive connectors 82. Thus, the redistribution structure 310 is connected to the conductive vias 62 (see FIG. 19), the conductive vias 302 (if present, see FIG. 19), and the interposer 110. Further, in these embodiments, the die stack 60A includes one integrated circuit die 50B instead of the three integrated circuit dies 50B shown in FIGS. 16-19, but it should be appreciated that any desired quantity of integrated circuit dies 50B may be included in the die stack 60A. The heat spreader 208 may be attached to the top surface of integrated circuit die 50A.

FIGS. 24-29 are cross-sectional views of intermediate stages in the manufacturing of a die stack 60A, in accordance with some embodiments. The die stack 60A is formed by bonding integrated circuit dies 50A (which may not have conductive vias 62) to a wafer 400. In an embodiment, the die stack 60A is a system-on-integrated-chip (SoIC) device, although it should be appreciated that embodiments may be applied to other three-dimensional integrated circuit (3DIC) packages. The wafer 400 has a die region 400A, which includes a die formed therein, such as an integrated circuit die 50B (having conductive vias 62). The die region 400A will be singulated in subsequent processing to form the die stack 60A, which includes a singulated portion of the wafer 400 (e.g., an integrated circuit die 50B) and the integrated circuit dies 50A which are bonded to that singulated portion of the wafer 400. As will be subsequently described in greater detail, the die stack 60A may be used as a first integrated circuit device 80A in an integrated circuit package 150.

Processing of one die region 400A of the wafer 400 is illustrated. It should be appreciated that any number of die regions 400A of a wafer 400 can be simultaneously processed and singulated to form multiple die stacks 60A from the singulated portions of the wafer 400.

Figure 24:
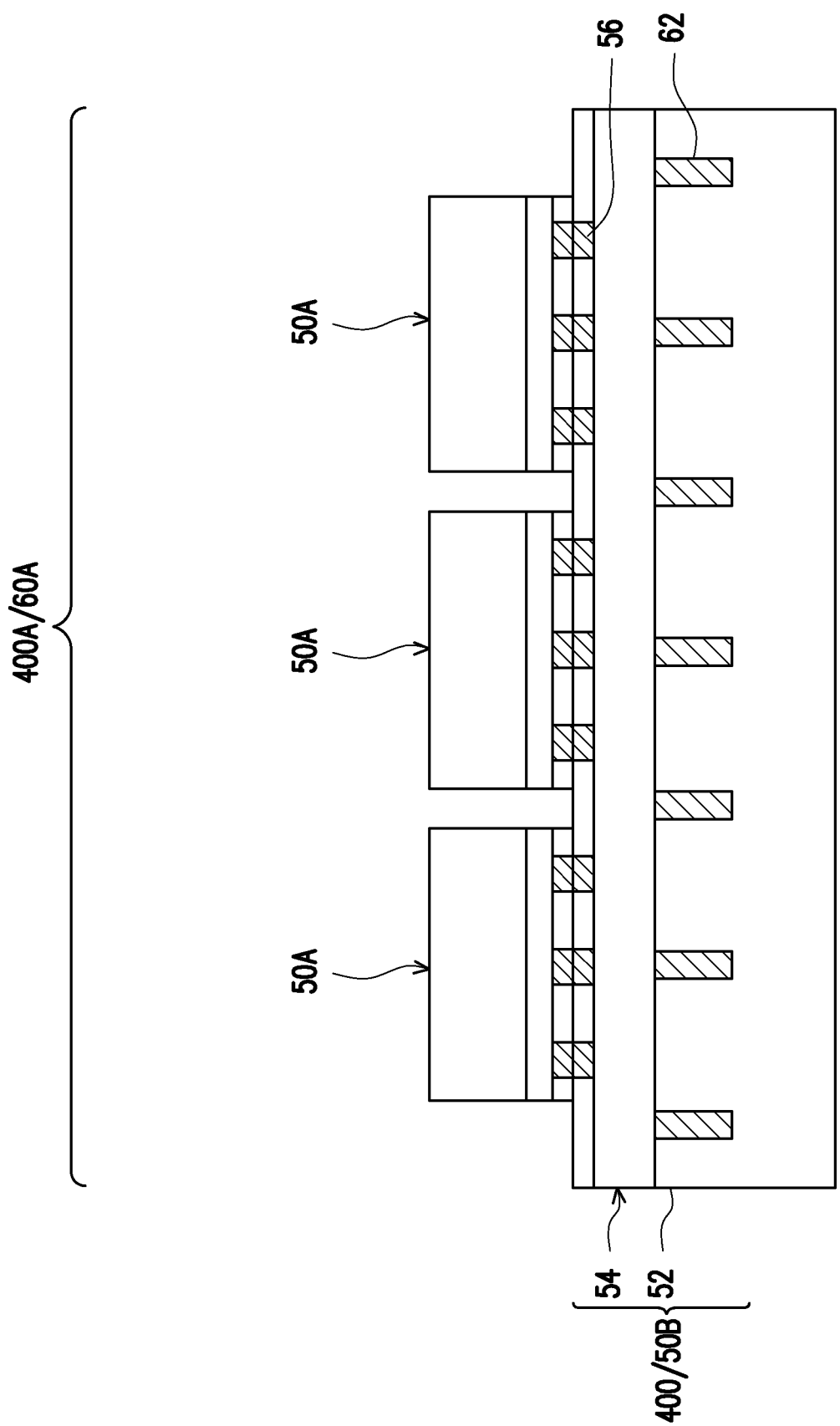
FIGS. 24-29 are cross-sectional views of intermediate stages in the manufacturing of a die stack, in accordance with some embodiments.

In FIG. 24, a wafer 400 is obtained or formed. The wafer 400 may be similar to the wafer 300 described for FIG. 16, and includes an integrated circuit die 50B in a die region 400A. The integrated circuit die 50B includes conductive vias 62 that extend into the interconnect structure 54 and/or the semiconductor substrate 52. Integrated circuit dies 50A are then attached to the wafer 400, in a similar manner as described for FIG. 16. Any desired quantity of integrated circuit dies 50A may be attached to the wafer 400.

Figure 25:
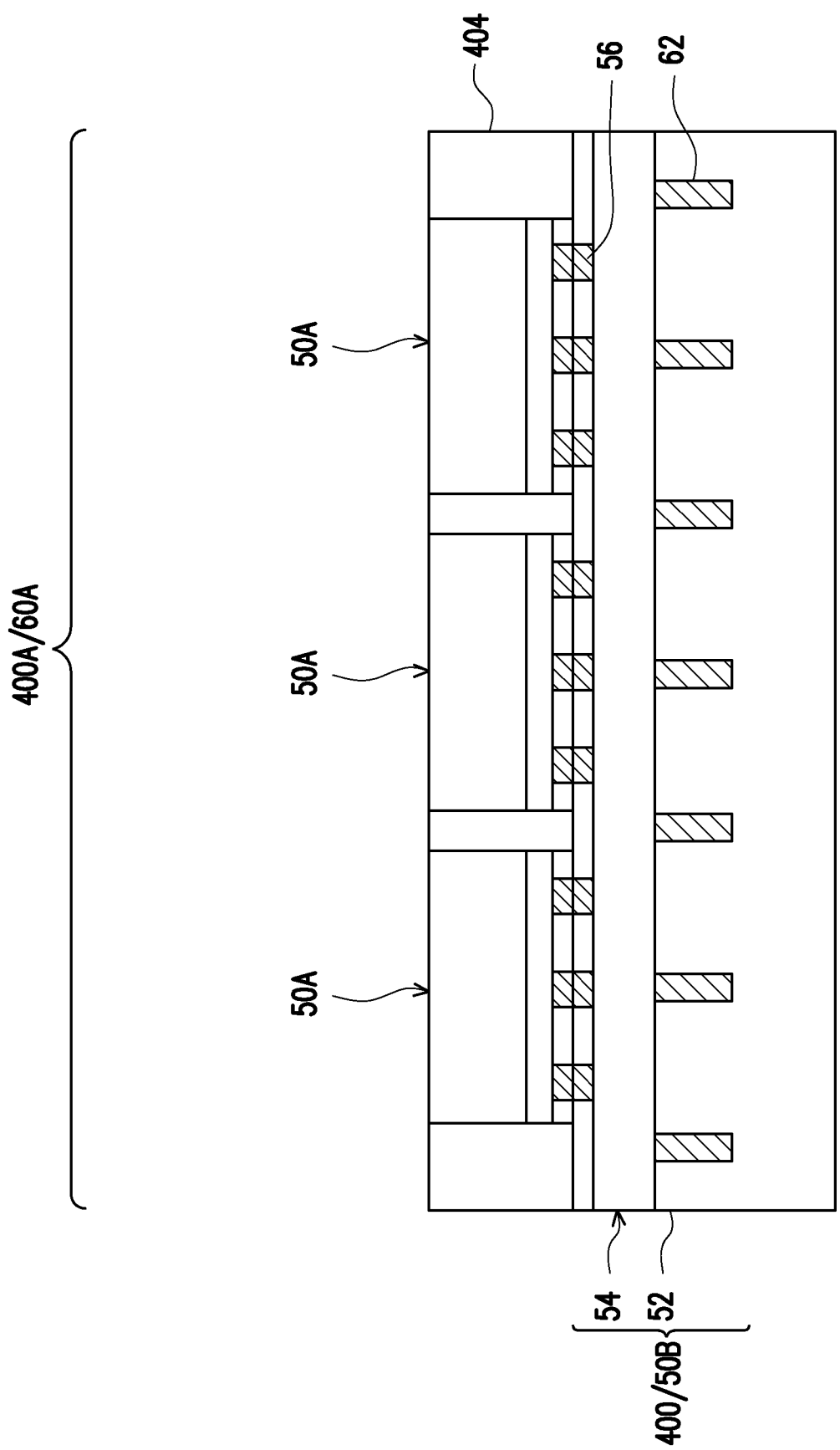

In FIG. 25, an encapsulant 404 is formed on and around the various components. The encapsulant 404 may be similar to the encapsulant 96 described for FIG. 17, and may be formed by similar processes. The encapsulant 404 is optionally thinned to expose the integrated circuit dies 50A. The encapsulant 404 may be thinned in a similar manner as described for FIG. 17.

Figure 26:
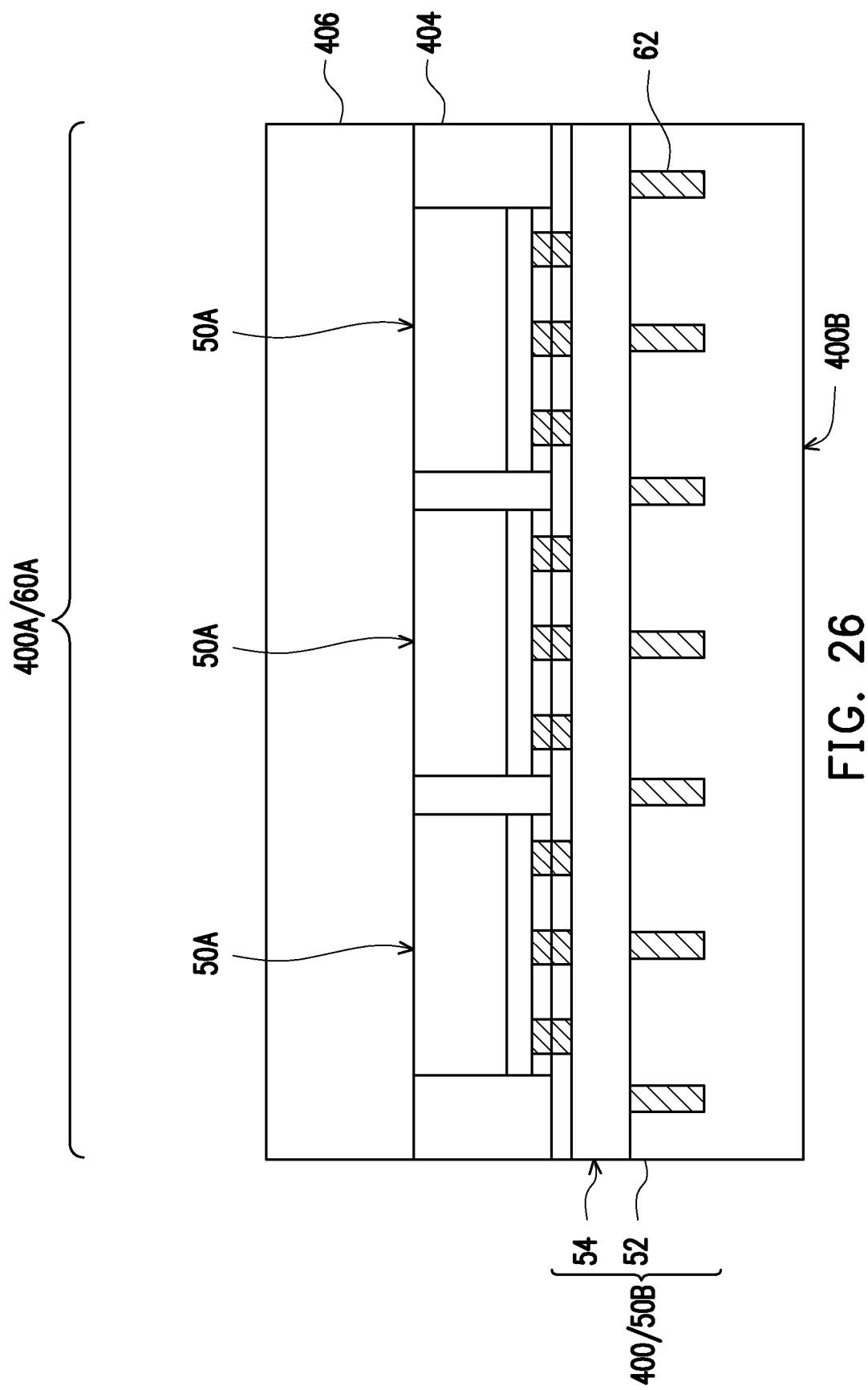

In FIG. 26, the intermediate structure is flipped over (not separately illustrated) to prepare for processing of the back side 400B of the wafer 400. The intermediate structure may be placed on a carrier substrate 406 or other suitable support structure for subsequent processing. The carrier substrate 406 may be similar to the carrier substrate 98 described for FIG. 8, and may be attached to the encapsulant 404 in a similar manner as described for FIG. 8.

Figure 27:
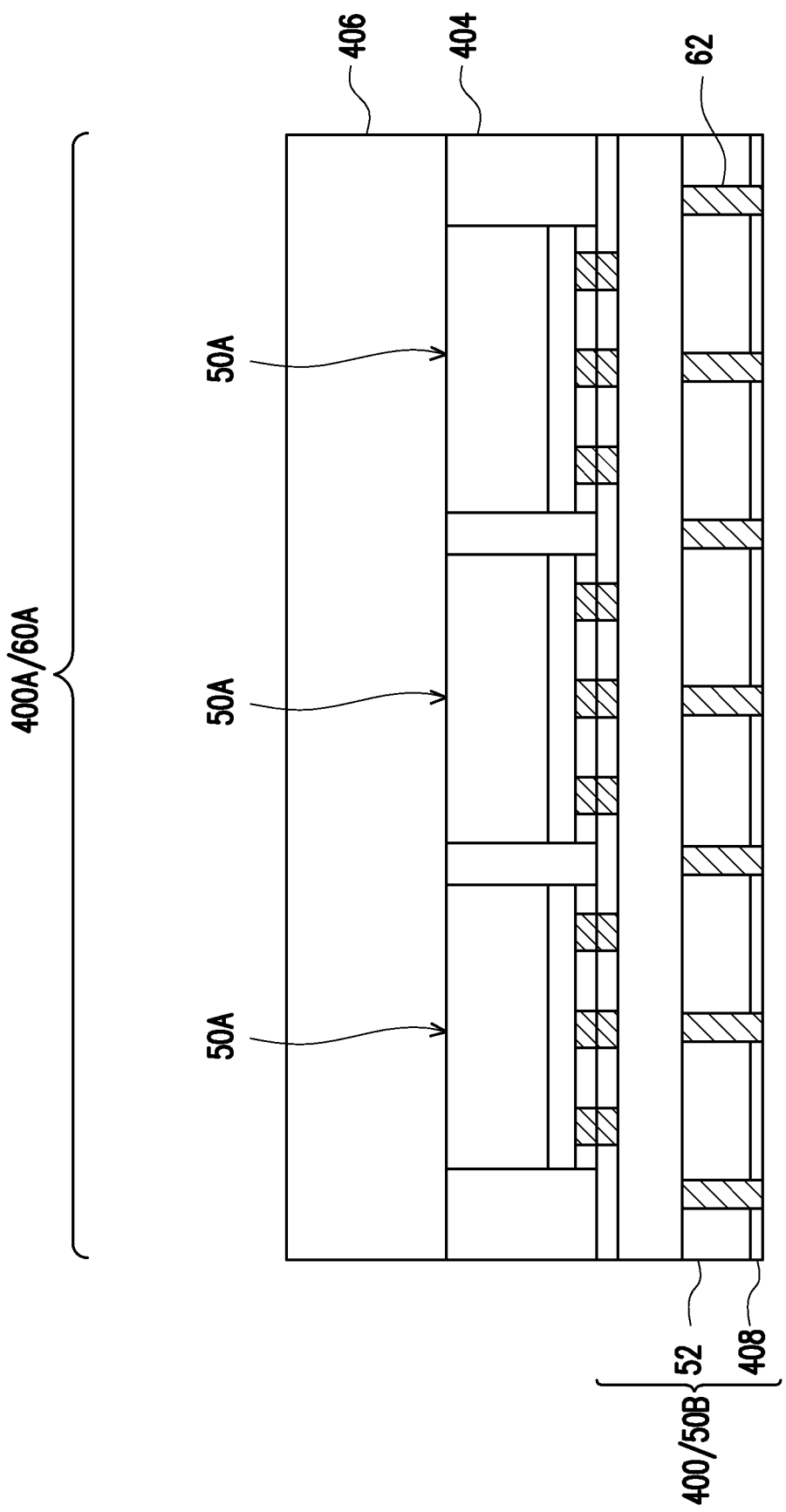

In FIG. 27, the substrate 52 of the wafer 400 is thinned to expose the conductive vias 62. The substrate 52 may be thinned in a similar manner as described for FIG. 9. An insulating layer 408 may optionally be formed on the back surface of the substrate 52, surrounding the protruding portions of the conductive vias 62. The insulating layer 408 may be similar to the insulating layer 102 described for FIG. 9, and may be formed by similar processes.

Figure 28:
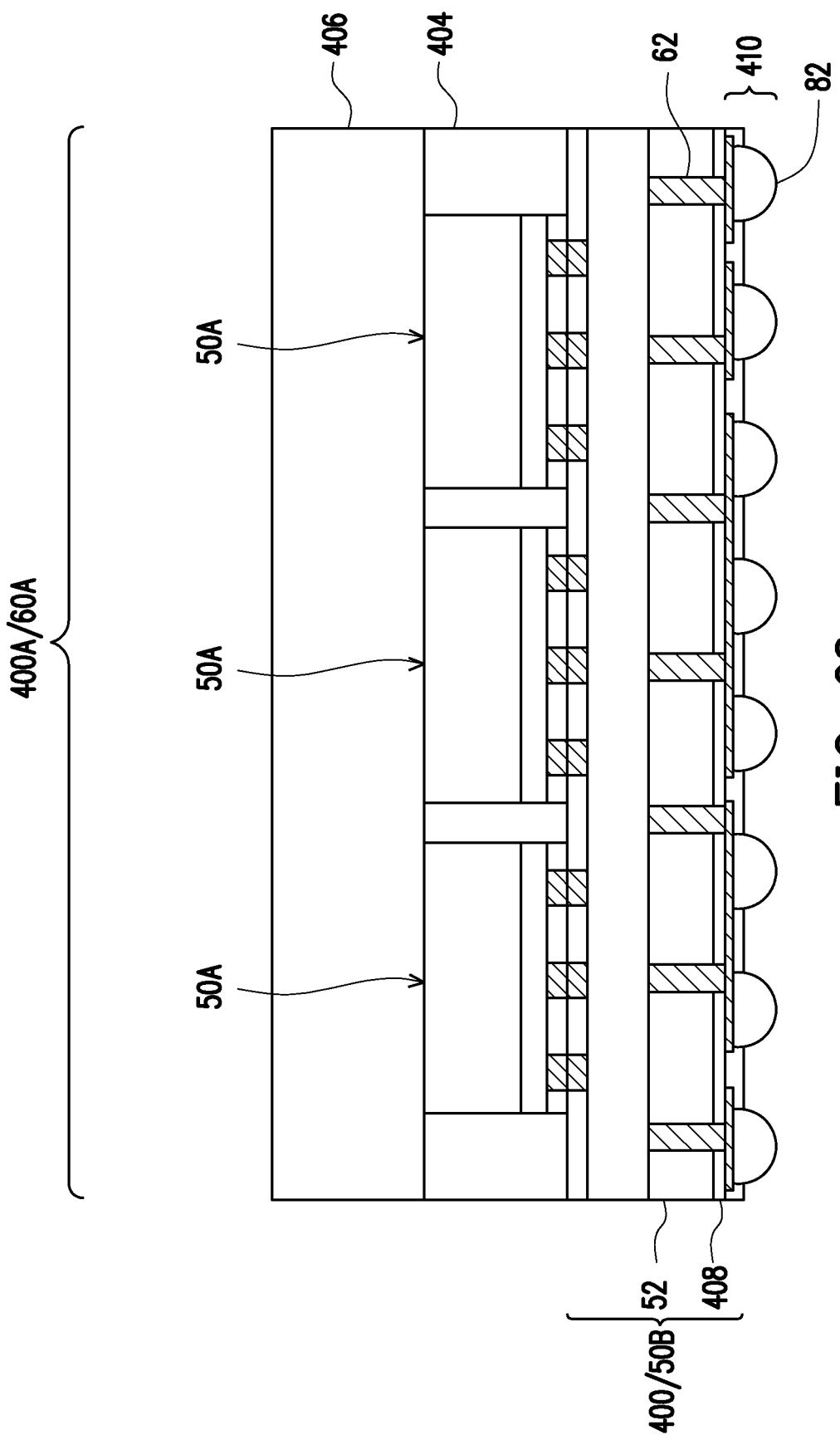

In FIG. 28, a redistribution structure 410 is formed on the substrate 52, the conductive vias 62, and the insulating layer 408 (if present). The redistribution structure 410 may be similar to the redistribution structure 310 described for FIG. 19, and may be formed by similar processes. The conductive connectors 82 (previously described) are formed on the redistribution structure 410. The conductive connectors 82 may be connected to metallization layers of the redistribution structure 410. For example, the conductive connectors 82 may be formed on under-bump metallizations (UBMs) of the redistribution structure 410.

Figure 29:
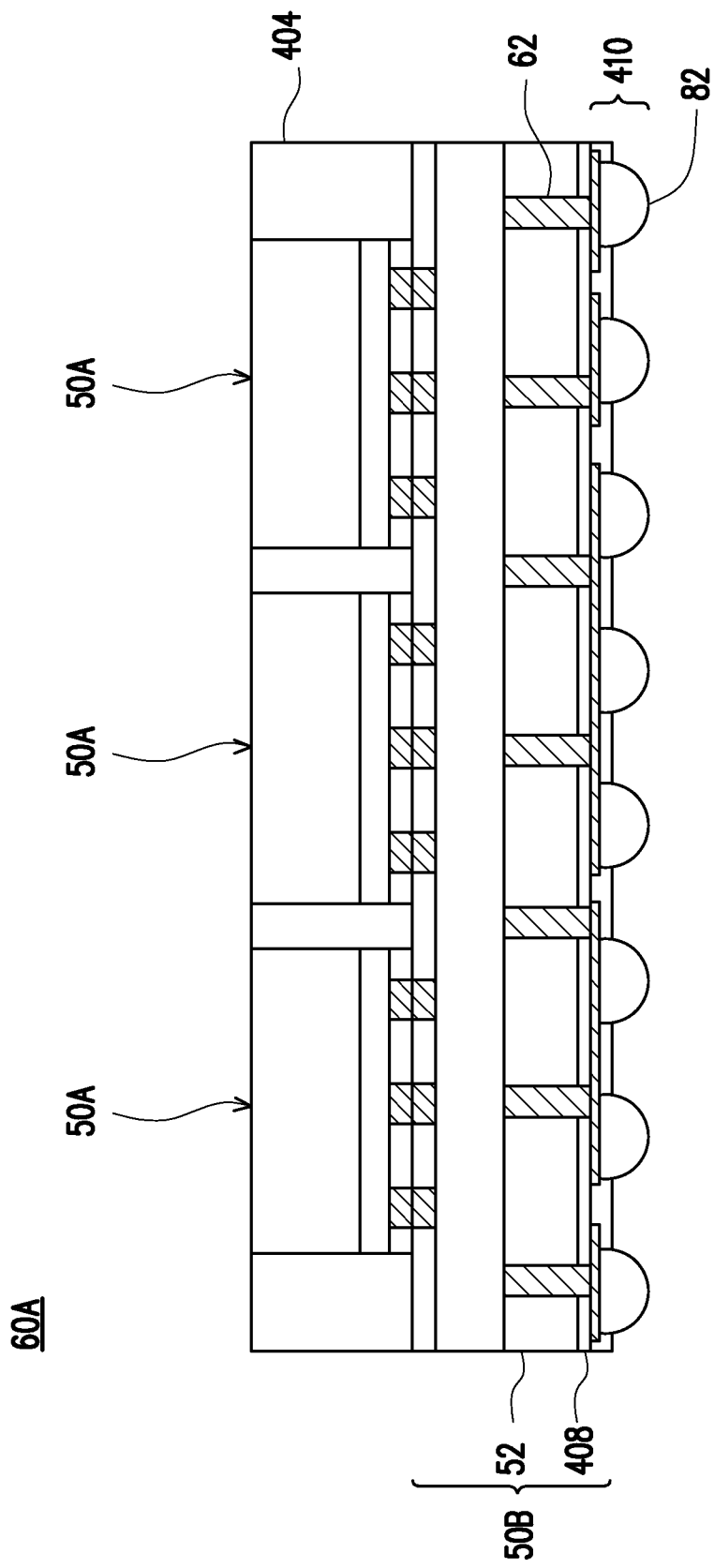
Figure 30:
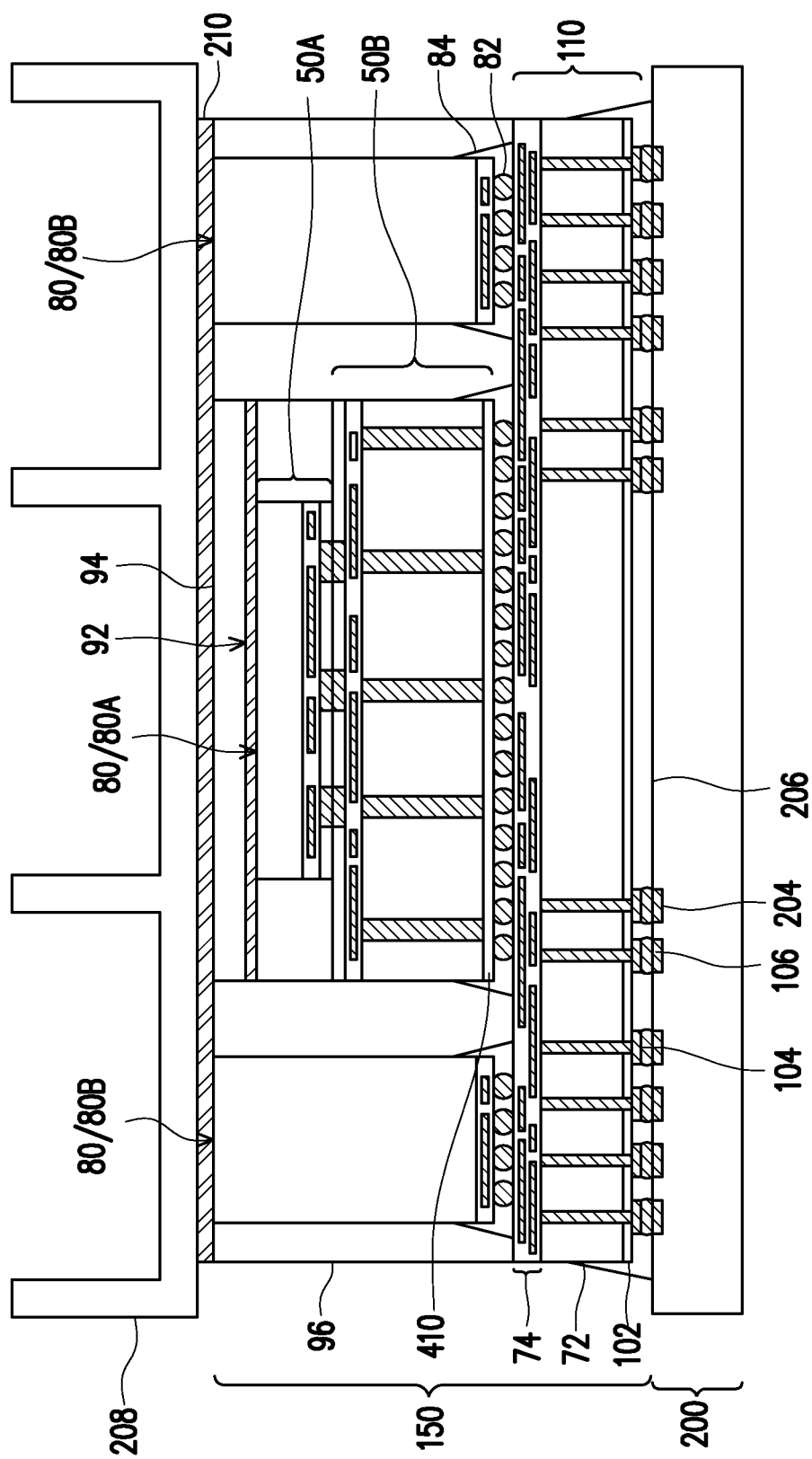
FIGS. 30-33 are cross-sectional views of integrated circuit packages, in accordance with some embodiments.
Figure 31:
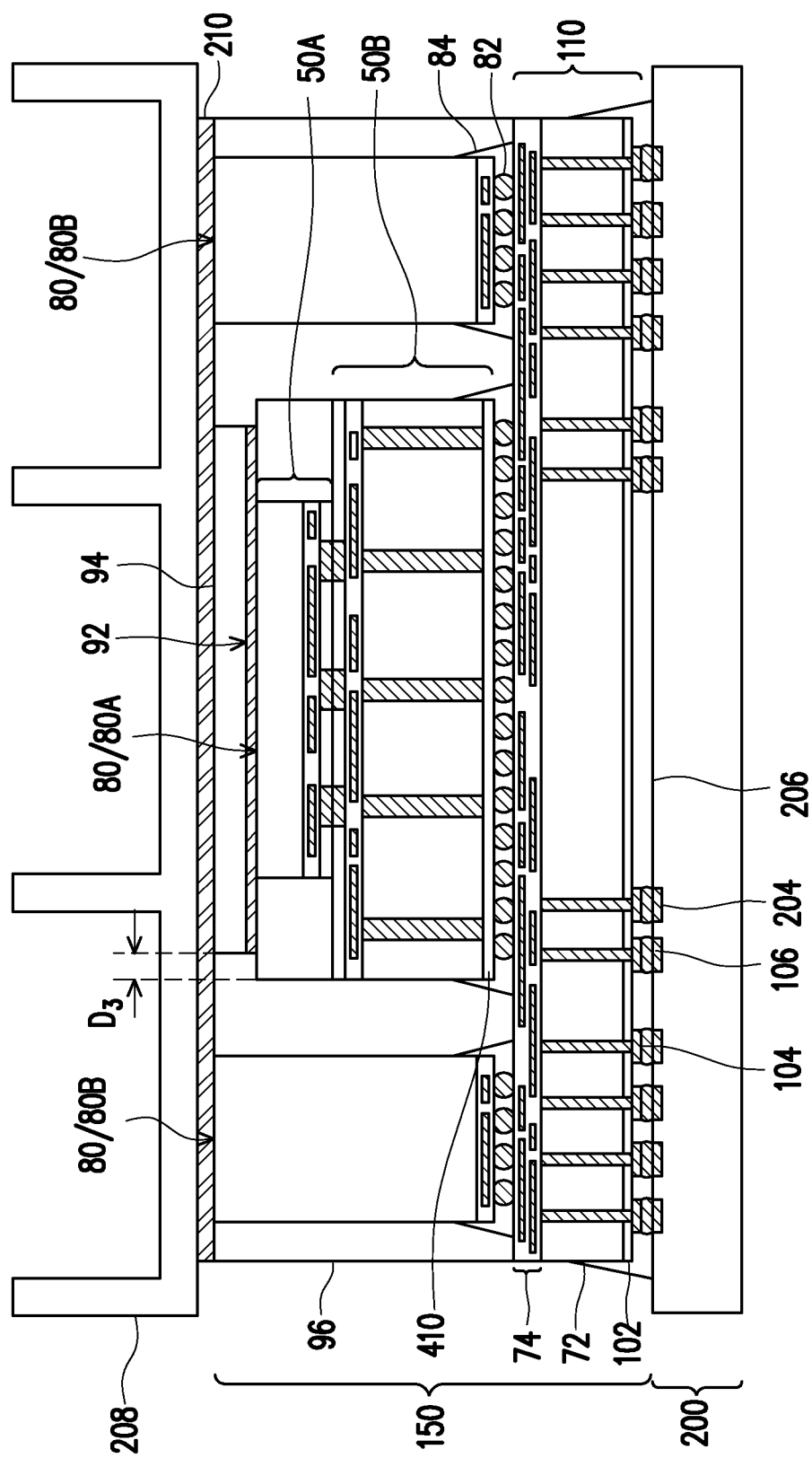
Figure 32:
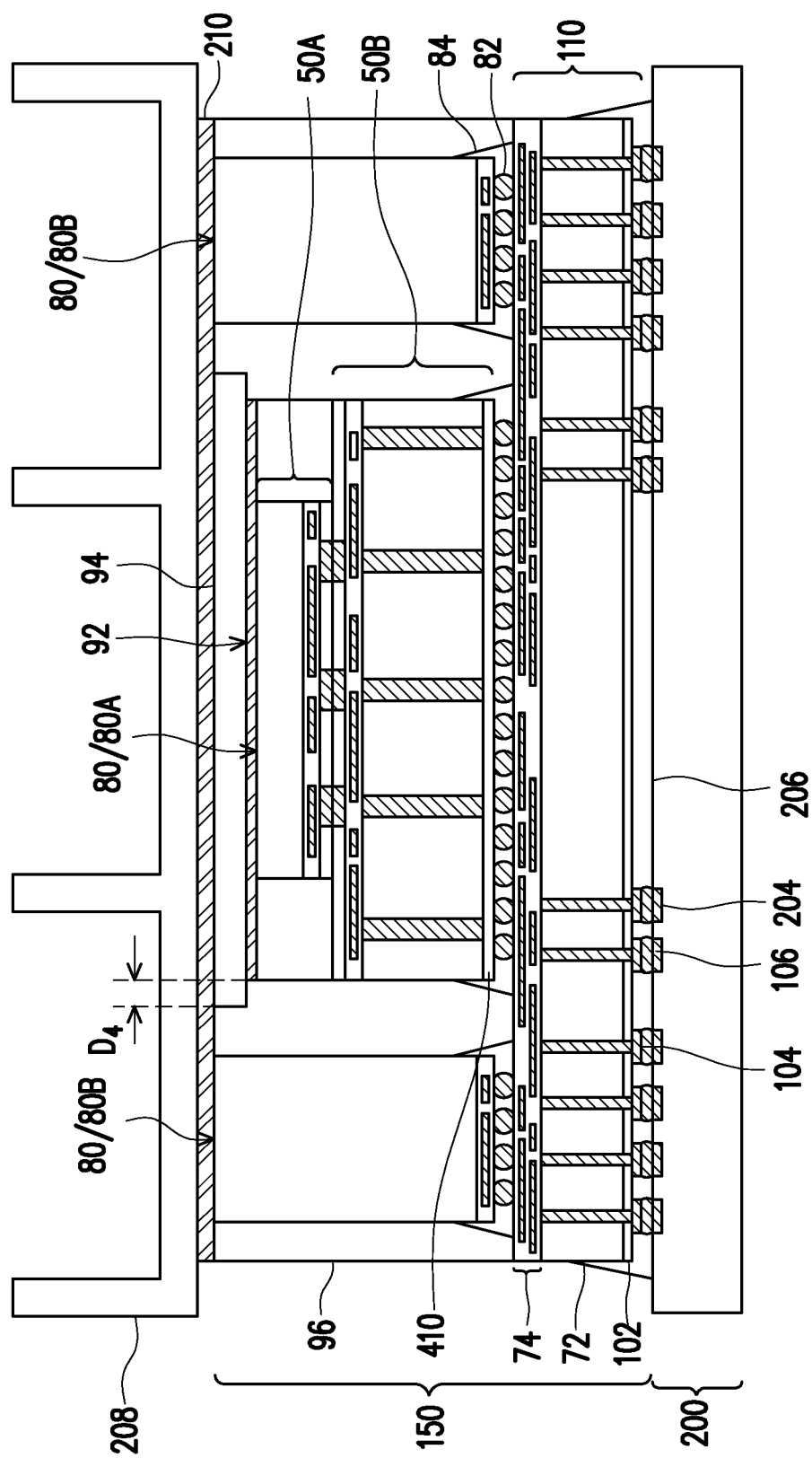
Figure 33:
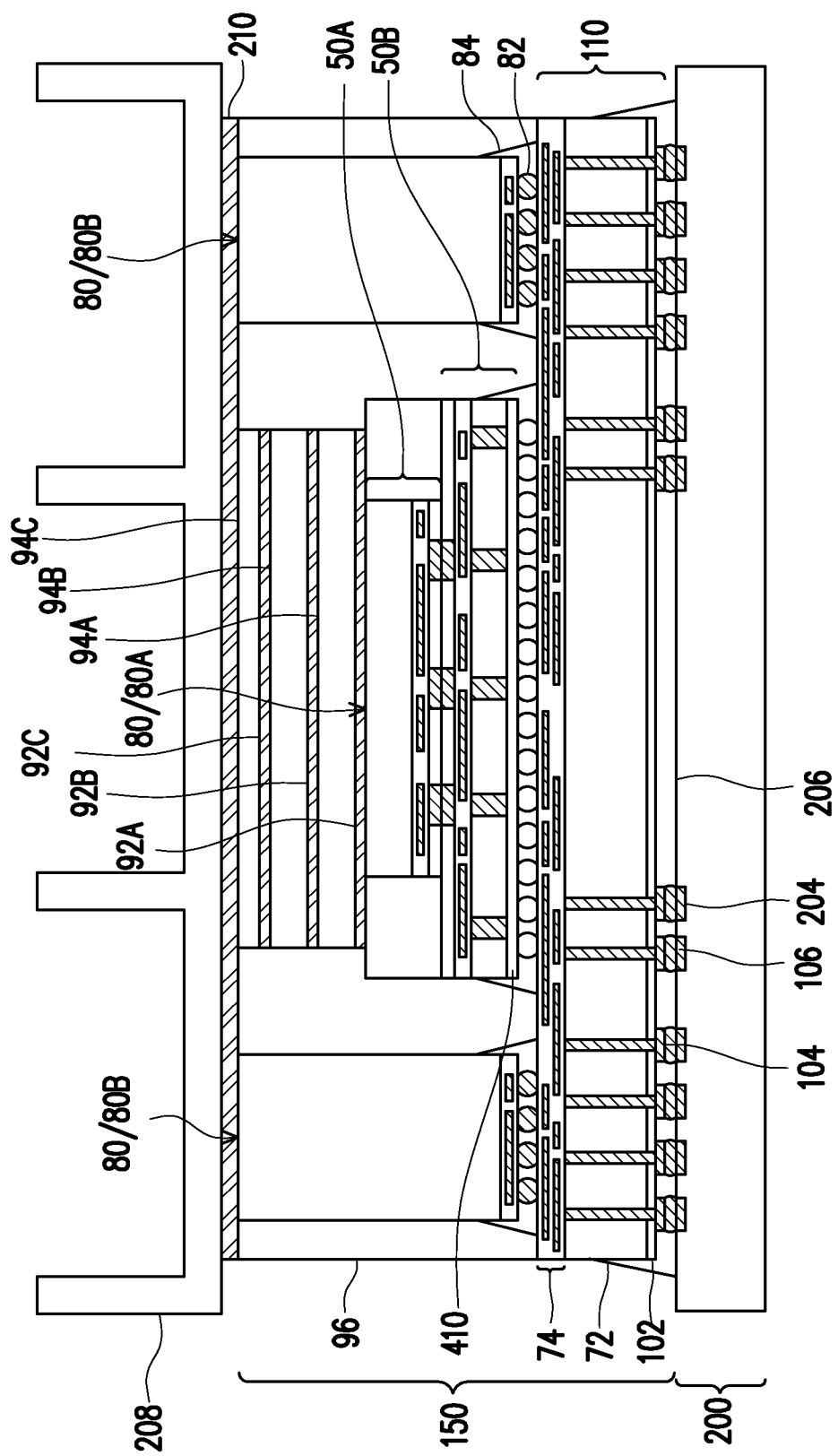

In FIG. 29, a carrier debonding is performed to detach (debond) the carrier substrate 406 from the encapsulant 404. The carrier substrate 406 may be detached in a similar manner as described for FIG. 11.

A singulation process is performed by cutting along scribe line regions, e.g., around the die region 400A. The singulation process may include sawing, dicing, or the like. For example, the singulation process can include sawing the redistribution structure 410, the encapsulant 404, and the wafer 400. The singulation process singulates the die region 400A from adjacent die regions. The resulting, singulated die stack 60A is from the die region 400A. The singulation process forms integrated circuit dies 50B from the singulated portions of the wafer 400. As a result of the singulation process, the outer sidewalls of the redistribution structure 410, the encapsulant 404, and the integrated circuit die 50B are laterally coterminous (within process variations). The integrated circuit dies 50A each have a lesser width than the integrated circuit die 50B.

FIGS. 30, 31, 32, and 33 are cross-sectional views of integrated circuit packages, in accordance with some embodiments. These embodiments are similar to the embodiments described for FIGS. 11, 12, 13, and 14, except the first integrated circuit device 80A is a similar die stack 60A as that described for FIGS. 24-29. Some features of the die stack 60A are omitted for illustration clarity. In these embodiments, the redistribution structure 320 of the die stack 60A is attached to the interposer 110 with solder bonds, e.g., the conductive connectors 82. Thus, the redistribution structure 410 is connected to the conductive vias 62 and the interposer 110. Further, in these embodiments, the die stack 60A includes one integrated circuit die 50A instead of the three integrated circuit dies 50A shown in FIGS. 24-29, but it should be appreciated that any desired quantity of integrated circuit dies 50A may be included in the die stack 60A. The heat spreader 208 may be attached to the top surface of integrated circuit die 50A.

Embodiments may achieve advantages. Filling the gap $G_1$ (see FIG. 4) over the first integrated circuit device 80A with the adhesive layer 92 (if present) and the heat dissipation die 94 helps reduce the amount of encapsulant 96 remaining over the first integrated circuit device 80A in the integrated circuit package 150. Stress concentration and die cracking may thus be avoided. Further, the heat spreader 208 may be attached to the top surface of the heat dissipation die 94, which is formed of a material with high thermal conductivity. The heat dissipation die 94 thus increases thermal conductivity from the first integrated circuit device 80A to the heat spreader 208. Heat dissipation efficiency in the integrated circuit package 150 may thus be improved.

In an embodiment, a device includes: an interposer; a first integrated circuit device attached to the interposer; a second integrated circuit device attached to the interposer adjacent the first integrated circuit device; a heat dissipation die on the second integrated circuit device; and an encapsulant around the heat dissipation die, the second integrated circuit device, and the first integrated circuit device, a top surface of the encapsulant being coplanar with a top surface of the heat dissipation die and a top surface of the first integrated circuit device. In some embodiments of the device, the top surface of the heat dissipation die is disposed the same distance from the interposer as the top surface of the first integrated circuit device. In some embodiments of the device, a width of the heat dissipation die equals a width of the second integrated circuit device. In some embodiments of the device, a width of the heat dissipation die is greater than a width of the second integrated circuit device. In some embodiments of the device, a width of the heat dissipation die is less than a width of the second integrated circuit device. In some embodiments of the device, the heat dissipation die is one of a plurality of heat dissipation dies disposed on the second integrated circuit device. In some embodiments of the device, the first integrated circuit device is a first die stack and the second integrated circuit device is a second die stack. In some embodiments of the device, the first integrated circuit device is a die stack and the second integrated circuit device is an integrated circuit die. In some embodiments, the device further includes: a heat spreader on the top surface of the encapsulant, the top surface of the heat dissipation die, and the top surface of the first integrated circuit device.

In an embodiment, a device includes: an interposer; a first die stack bonded to a front side of the interposer; a second die stack bonded to the front side of the interposer, a top surface of the second die stack disposed closer to the interposer than a top surface of the first die stack; a heat dissipation die on the second die stack, a top surface of the heat dissipation die disposed the same distance from the interposer as the top surface of the first die stack; and a heat spreader on the top surface of the heat dissipation die and the top surface of the second die stack. In some embodiments of the device, the second die stack includes: a first integrated circuit die; a second integrated circuit die bonded to the first integrated circuit die, the second integrated circuit die including first conductive vias; an encapsulant around the second integrated circuit die; and a redistribution structure on the encapsulant and the second integrated circuit die, the redistribution structure connected to the first conductive vias and the interposer. In some embodiments of the device, the second die stack further includes: second conductive vias extending through the encapsulant, the second conductive vias connected to the first integrated circuit die and the redistribution structure. In some embodiments of the device, the second die stack includes: an encapsulant; a first integrated circuit die in the encapsulant; a second integrated circuit die bonded to the first integrated circuit die, the second integrated circuit die including conductive vias; and a redistribution structure on the second integrated circuit die, the redistribution structure connected to the conductive vias and the interposer. In some embodiments, the device further includes: an encapsulant around the first die stack, the second die stack, and the heat dissipation die, a top surface of the encapsulant disposed the same distance from the interposer as the top surface of the first die stack and the top surface of the heat dissipation die.

In an embodiment, a method includes: bonding a first integrated circuit device and a second integrated circuit device to a front side of a interposer; adhering a heat dissipation die on the first integrated circuit device; encapsulating the heat dissipation die, the first integrated circuit device, and the second integrated circuit device with an encapsulant; thinning the encapsulant and the heat dissipation die and the second integrated circuit device until a top surface of the encapsulant is coplanar with a top surface of the heat dissipation die and a top surface of the first integrated circuit device; and adhering a heat spreader to the top surface of the encapsulant, the top surface of the heat dissipation die, and the top surface of the second integrated circuit device. In some embodiments of the method, a first portion of the encapsulant covers the top surface of the heat dissipation die, and thinning the encapsulant removes the first portion of the encapsulant. In some embodiments of the method, the top surface of the second integrated circuit device is disposed further from the interposer than the top surface of the first integrated circuit device, the top surface of the heat dissipation die is disposed further from the interposer than the top surface of the second integrated circuit device before thinning the heat dissipation die, and the top surface of the heat dissipation die is disposed the same distance from the interposer as the top surface of the second integrated circuit device after thinning the heat dissipation die. In some embodiments of the method, the second integrated circuit device is a high bandwidth memory (HBM) device. In some embodiments of the method, the first integrated circuit device is a system-on-integrated-chip (SoIC) device. In some embodiments of the method, the first integrated circuit device is an integrated circuit die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   bonding a first integrated circuit device and a second integrated circuit device to a front side of an interposer;
   adhering a plurality of heat dissipation dies in a stack on the first integrated circuit device, the heat dissipation dies comprising an upper heat dissipation die;
   encapsulating the heat dissipation dies, the first integrated circuit device, and the second integrated circuit device with an encapsulant;
   thinning the encapsulant, the upper heat dissipation die, and the second integrated circuit device until a top surface of the encapsulant is coplanar with a top surface of the upper heat dissipation die and a top surface of the second integrated circuit device; and
   adhering a heat spreader to the top surface of the encapsulant, the top surface of the upper heat dissipation die, and the top surface of the second integrated circuit device.

2. The method of claim 1, wherein a first portion of the encapsulant covers the top surface of the upper heat dissipation die, and thinning the encapsulant removes the first portion of the encapsulant.

3. The method of claim 1, wherein the top surface of the second integrated circuit device is disposed further from the interposer than the top surface of the first integrated circuit device, the top surface of the upper heat dissipation die is disposed further from the interposer than the top surface of the second integrated circuit device before thinning the upper heat dissipation die, and the top surface of the upper heat dissipation die is disposed the same distance from the interposer as the top surface of the second integrated circuit device after thinning the upper heat dissipation die.

4. The method of claim 1, wherein the second integrated circuit device is a high bandwidth memory (HBM) device.

5. The method of claim 1, wherein the first integrated circuit device is a system-on-integrated-chip (SoIC) device.

6. The method of claim 1, wherein the first integrated circuit device is an integrated circuit die.

7. The method of claim 1, wherein a width of the heat dissipation dies equals a width of the first integrated circuit device.

8. The method of claim 1, wherein a width of the heat dissipation dies is greater than a width of the first integrated circuit device.

9. The method of claim 1, wherein a width of the heat dissipation dies is less than a width of the first integrated circuit device.

10. A method comprising:
    bonding a first die stack and a second die stack to a front side of an interposer;
    adhering a plurality of heat dissipation dies in a stack on the first die stack, the heat dissipation dies comprising an upper heat dissipation die;
    encapsulating the heat dissipation dies, the first die stack, and the second die stack with a first encapsulant;
    thinning the first encapsulant and the upper heat dissipation die until a top surface of the first encapsulant is coplanar with a top surface of the upper heat dissipation die and a top surface of the second die stack; and
    adhering a heat spreader to the top surface of the first encapsulant, the top surface of the upper heat dissipation die, and the top surface of the second die stack.

11. The method of claim 10, wherein the top surface of the second die stack is disposed further from the interposer than the top surface of the first die stack, the top surface of the upper heat dissipation die is disposed further from the interposer than the top surface of the second die stack before thinning the upper heat dissipation die, and the top surface of the upper heat dissipation die is disposed the same distance from the interposer as the top surface of the second die stack after thinning the upper heat dissipation die.

12. The method of claim 10, further comprising forming the second die stack by:
    bonding a first integrated circuit die to a second integrated circuit die, the first integrated circuit die comprising first conductive vias;
    encapsulating the first integrated circuit die with a second encapsulant; and
    forming a redistribution structure on the second encapsulant and the first integrated circuit die, the redistribution structure connected to the first conductive vias.

13. The method of claim 10, further comprising forming the second die stack by:

bonding a first integrated circuit die to a second integrated circuit die, the first integrated circuit die comprising first conductive vias;

encapsulating the second integrated circuit die with a second encapsulant; and forming a redistribution structure on the first integrated circuit die, the redistribution structure connected to the first conductive vias.

14. The method of claim 10, wherein a width of the heat dissipation dies equals a width of the first die stack.

15. The method of claim 10, wherein a width of the heat dissipation dies is greater than a width of the first die stack.

16. The method of claim 10, wherein a width of the heat dissipation dies is less than a width of the first die stack.

17. A method comprising:

bonding a logic device and a memory device to a front side of an interposer;

adhering a heat dissipation die stack on the logic device, the heat dissipation die stack comprising an upper heat dissipation die and a lower heat dissipation die, the upper heat dissipation die and the lower heat dissipation die each having a greater width than the logic device;

encapsulating the heat dissipation die stack, the logic device, and the memory device with an encapsulant;

thinning the encapsulant and the upper heat dissipation die until a top surface of the encapsulant is coplanar with a top surface of the upper heat dissipation die and a top surface of the memory device, the upper heat dissipation die having a lesser thickness than the lower heat dissipation die after thinning the upper heat dissipation die; and adhering a heat spreader to the top surface of the encapsulant, the top surface of the upper heat dissipation die, and the top surface of the memory device.

18. The method of claim 17, wherein the logic device is a system-on-integrated-chip (SoIC) device and the memory device is a high bandwidth memory (HBM) device.

19. The method of claim 17, wherein a first portion of the encapsulant covers the top surface of the upper heat dissipation die, and thinning the encapsulant removes the first portion of the encapsulant.

20. The method of claim 17, wherein the top surface of the memory device is disposed further from the interposer than the top surface of the logic device, the top surface of the upper heat dissipation die is disposed further from the interposer than the top surface of the memory device before thinning the upper heat dissipation die, and the top surface of the upper heat dissipation die is disposed the same distance from the interposer as the top surface of the memory device after thinning the upper heat dissipation die.

* * * * *